US009343164B2

(12) United States Patent
Tseng et al.

(10) Patent No.: US 9,343,164 B2
(45) Date of Patent: May 17, 2016

(54) COMPENSATING SOURCE SIDE RESISTANCE VERSUS WORD LINE

(71) Applicant: SanDisk Technologies Inc., Plano, TX (US)

(72) Inventors: Huai-Yuan Tseng, San Ramon, CA (US); Dana Lee, Saratoga, CA (US); Shih-Chung Lee, Yokohama (JP); Deepanshu Dutta, Fremont, CA (US); Arash Hazeghi, San Francisco, CA (US)

(73) Assignee: SanDisk Technologies Inc., Plano, TX (US)

( * ) Notice: Subject to any disclaimer, the term of this patent is extended or adjusted under 35 U.S.C. 154(b) by 0 days.

(21) Appl. No.: 14/625,363

(22) Filed: Feb. 18, 2015

(65) Prior Publication Data

US 2015/0255166 A1    Sep. 10, 2015

Related U.S. Application Data

(60) Provisional application No. 61/949,601, filed on Mar. 7, 2014.

(51) Int. Cl.
| | |
|---|---|
| *G11C 16/06* | (2006.01) |
| *G11C 16/34* | (2006.01) |
| *G11C 16/28* | (2006.01) |
| *G11C 16/04* | (2006.01) |

(52) U.S. Cl.
CPC ............ *G11C 16/28* (2013.01); *G11C 16/0483* (2013.01); *G11C 16/3459* (2013.01)

(58) Field of Classification Search
CPC .... G11C 16/14; G11C 16/0483; G11C 16/04; G11C 16/28; G11C 16/3459; G11C 16/34
See application file for complete search history.

(56) References Cited

U.S. PATENT DOCUMENTS

| | | | |
|---|---|---|---|
| 7,292,476 B2 | 11/2007 | Goda et al. | |
| 7,468,919 B2 | 12/2008 | Sekar et al. | |
| 7,499,324 B2 | 3/2009 | Cernea et al. | |
| 7,808,819 B2 | 10/2010 | Murin et al. | |
| 8,199,579 B2 | 6/2012 | Shiino et al. | |
| 8,441,853 B2 | 5/2013 | Li | |
| 8,446,769 B2 | 5/2013 | Kim | |
| 8,638,608 B2 | 1/2014 | Lai et al. | |
| 8,804,425 B2 | 8/2014 | Chen et al. | |
| 8,804,430 B2 | 8/2014 | Lai et al. | |
| 2005/0265079 A1 | 12/2005 | Shirota | |
| 2011/0235420 A1* | 9/2011 | Sharon ............... | G11C 11/5642 365/185.17 |

(Continued)

OTHER PUBLICATIONS

International Search Report & The Written Opinion of the International Searching Authority dated Jun. 9, 2015, International Application No. PCT/US2015/018875.

*Primary Examiner* — Hien Nguyen
(74) *Attorney, Agent, or Firm* — Vierra Magen Marcus LLP

(57) ABSTRACT

A method and non-volatile storage system are provided in which the voltage applied to the source end of a NAND string depends on the location of the non-volatile storage element that is selected for sensing. This may be done without body-biasing the NAND string. Having the magnitude of the voltage applied to the source end of a NAND string depend on the location of the selected memory cell (without any body biasing) helps to mitigate failures that are dependent on which word line is selected during a sensing operation of one embodiment. Additionally, the magnitude of a read pass voltage may depend on either the source line voltage or the location of the selected memory cell.

21 Claims, 28 Drawing Sheets

(56) References Cited

U.S. PATENT DOCUMENTS

| | | |
|---|---|---|
| 2012/0081958 A1 | 4/2012 | Lee et al. |
| 2013/0223127 A1* | 8/2013 | Park .................. G11C 13/00 365/148 |
| 2014/0226415 A1* | 8/2014 | Toyama .................. G11C 16/24 365/185.25 |
| 2014/0269070 A1 | 9/2014 | Hsiung et al. |

* cited by examiner

Fig. 1
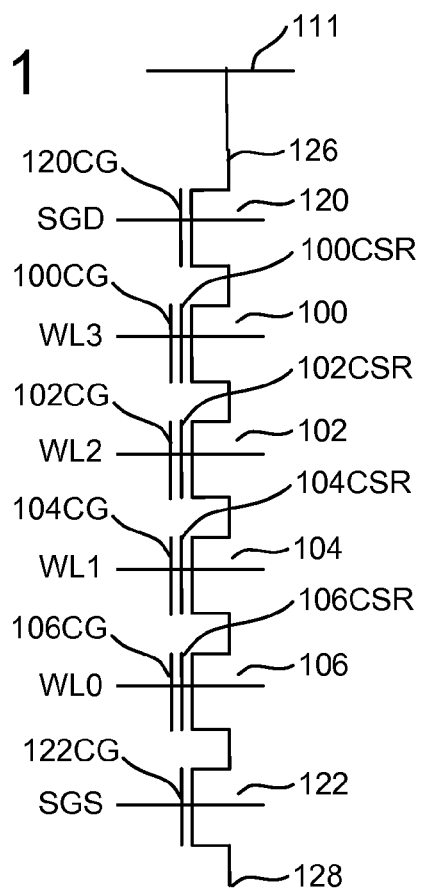
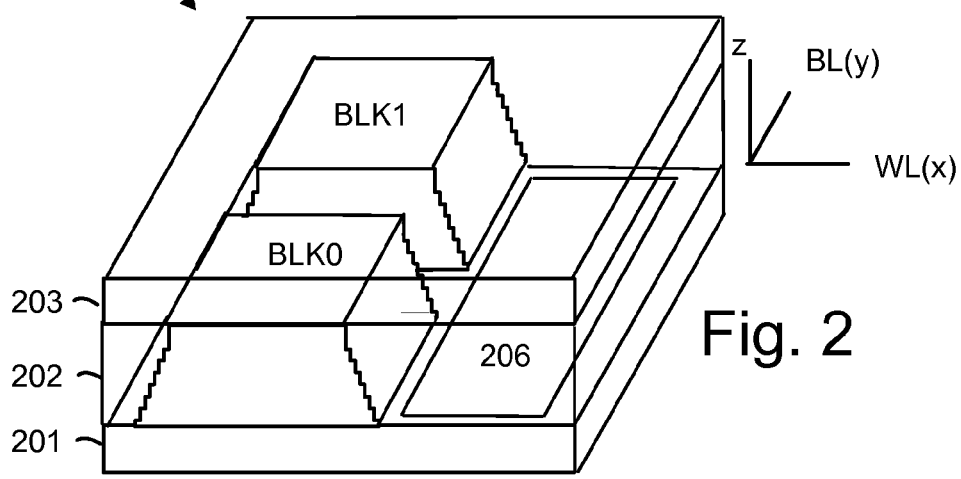
Fig. 2

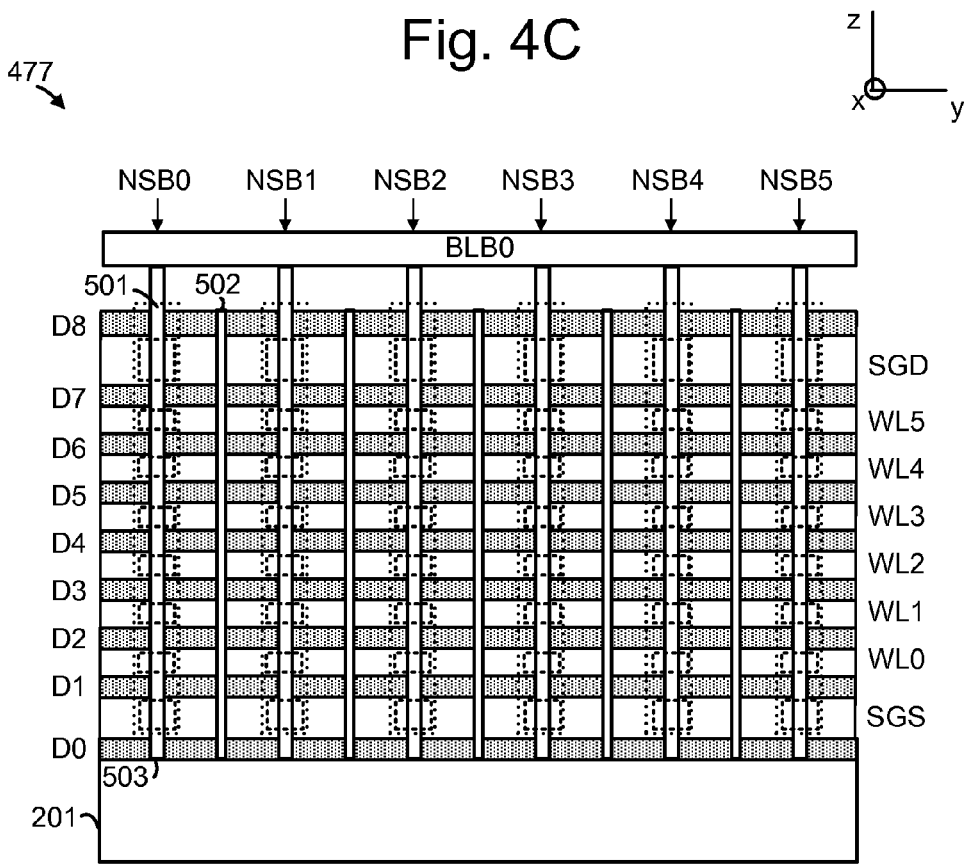

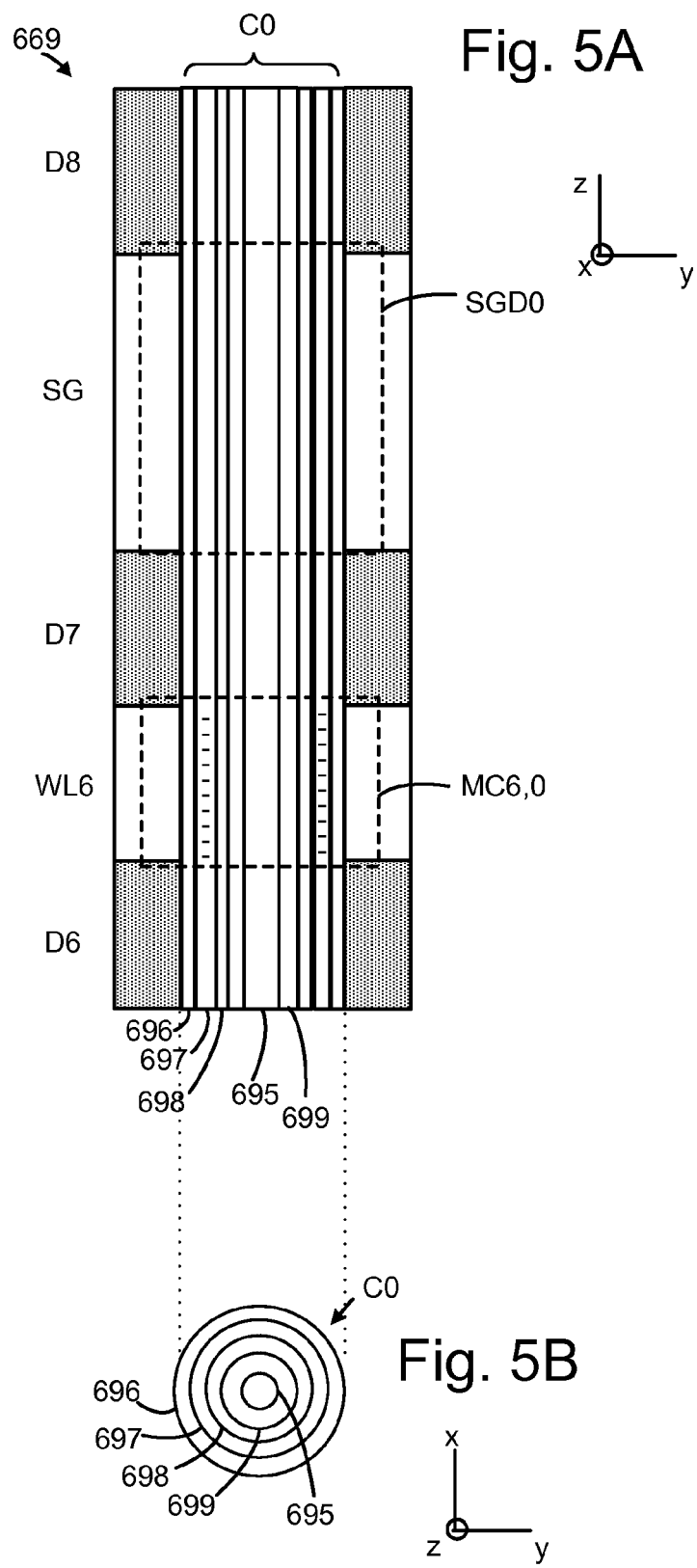

First programming pass

Second programming pass

Distance from source end of NAND string

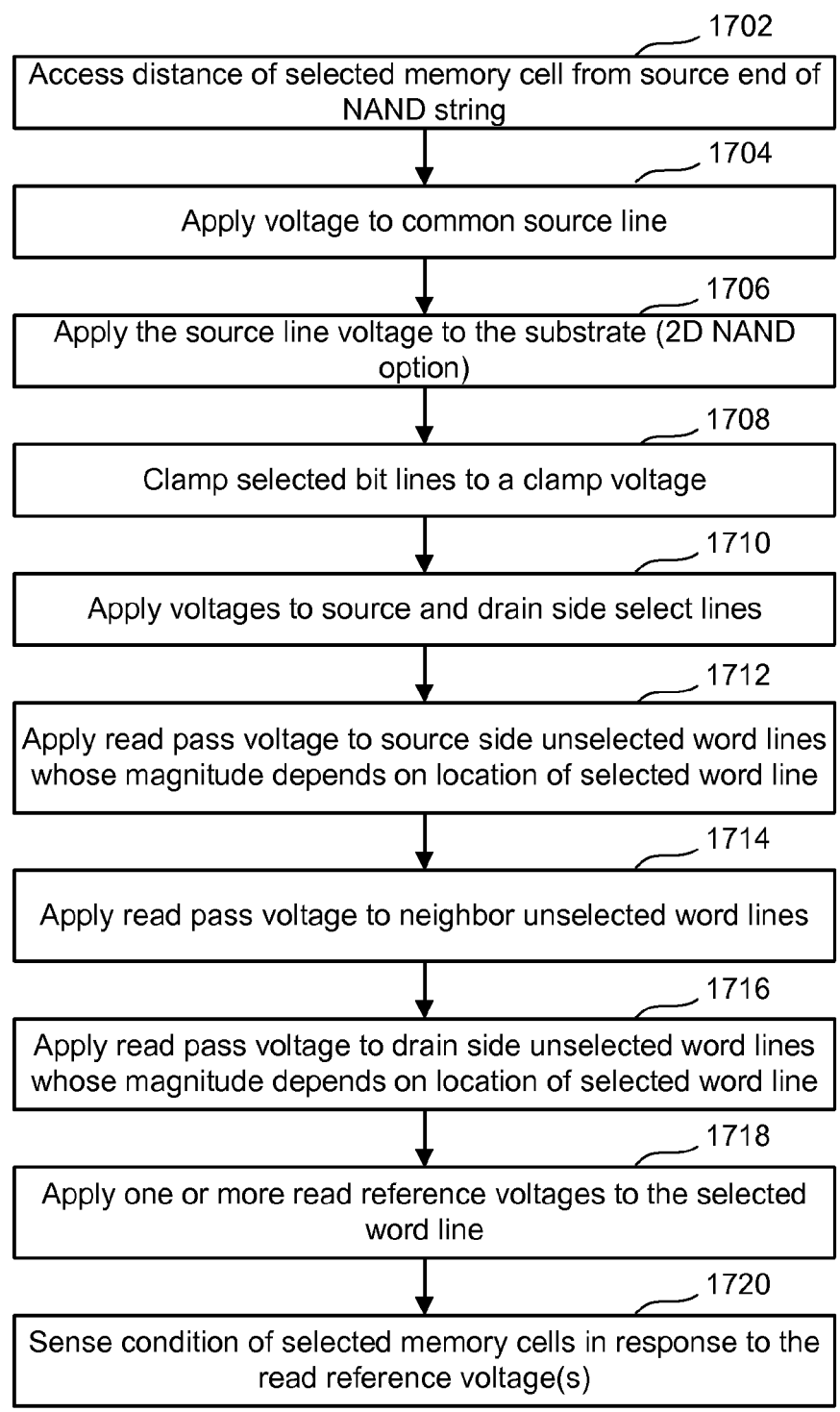

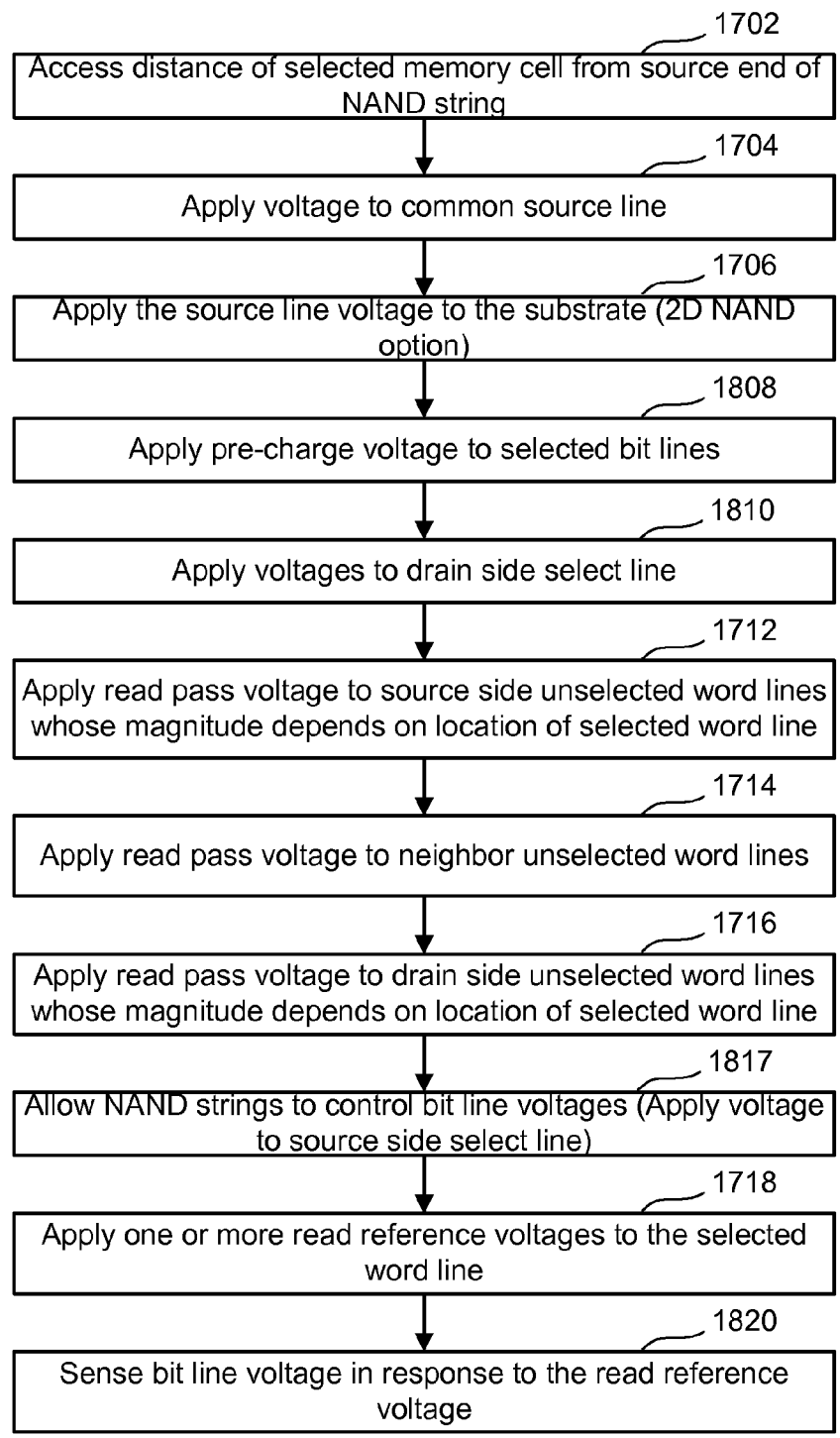

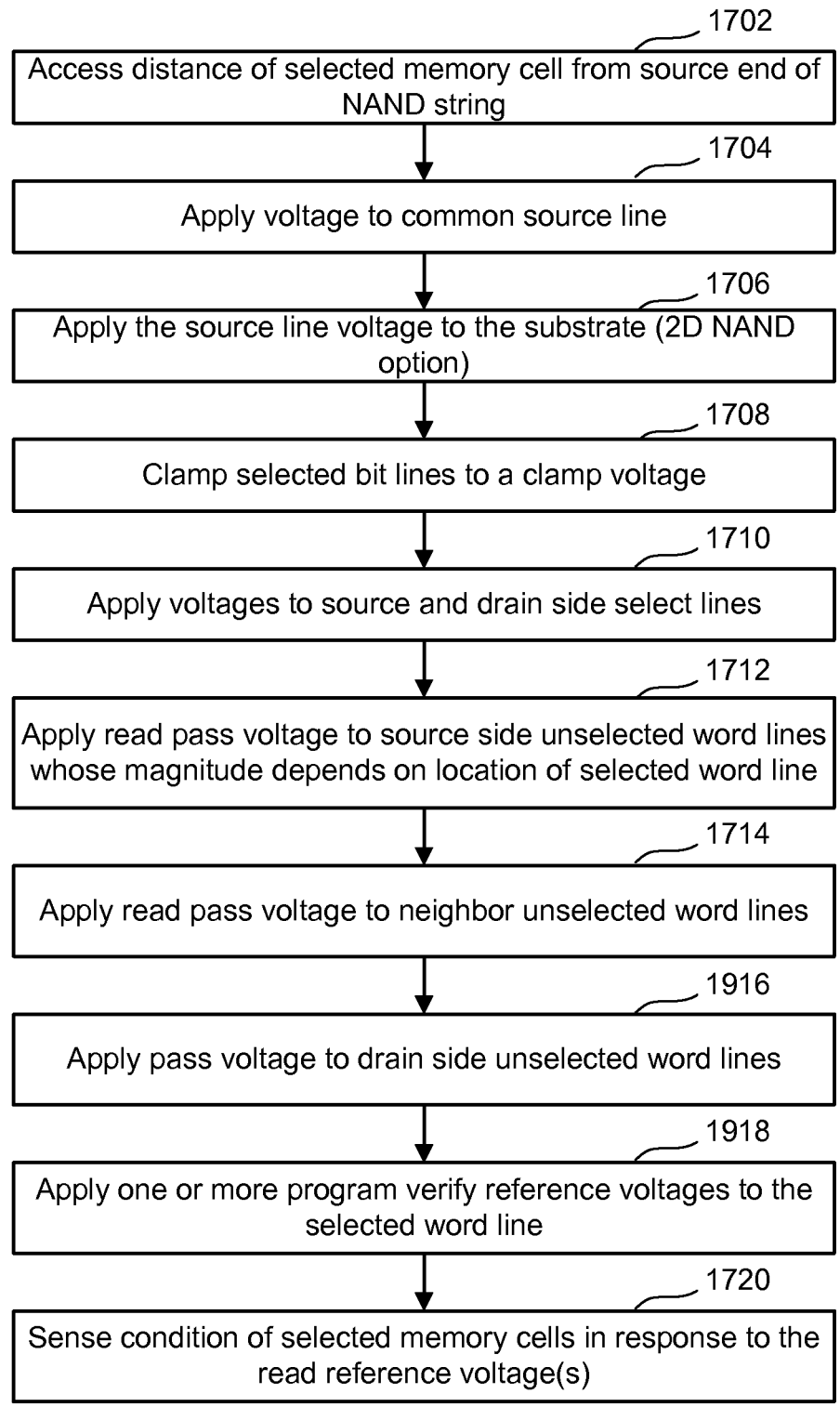

COMPENSATING SOURCE SIDE RESISTANCE VERSUS WORD LINE

PRIORITY CLAIM

This application claims the benefit of Provisional Application 61/949,601, "Compensating Source Side Resistance Versus Word Line to Balance Failure Bit Count," filed on Mar. 7, 2014, incorporated herein by reference in its entirety.

BACKGROUND

The present disclosure relates to technology for non-volatile storage.

Semiconductor memory is used in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some non-volatile memory store information in a charge storage region that is insulated from a channel region in a semiconductor substrate. As one example, a floating gate is positioned above and insulated from a channel region in a semiconductor substrate. The floating gate is located between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate.

Some non-volatile memory utilizes a charge trapping layer to store information. One such example is an oxide-nitride-oxide (ONO) region, in which the nitride (e.g., SiN) serves as a charge trapping layer to store information. When such a memory cell is programmed, electrons are stored in the charge trapping layer.

In one architecture, the memory cells are part of a NAND string. A NAND string includes series of memory cells between a drain side select gate and a source side select gate. The drain side select gate switchably connects one end of the NAND string to a bit line. The source side select gate switchably connects the other end of the NAND string to a common source line, which is connected to many NAND strings.

Non-volatile memory could have a 2D architecture or a 3D architecture. Recently, ultra high density storage devices have been proposed using a 3D stacked memory structure having strings of memory cells. One such storage device is sometimes referred to as a Bit Cost Scalable (BiCS) architecture. For example, a 3D NAND stacked memory device can be formed from an array of alternating conductor and insulator layers. A memory hole is drilled in the layers to define many memory layers simultaneously. A NAND string is then formed by filling the memory hole with appropriate materials. A straight NAND string extends in one memory hole, while a pipe- or U-shaped NAND string (P-BiCS) includes a pair of vertical columns of memory cells which extend in two memory holes and which are joined by a pipe connection. Control gates of the memory cells are provided by the conductor layers. Other techniques can be used to form 3D NAND.

BRIEF DESCRIPTION OF THE DRAWINGS

Like-numbered elements refer to common components in the different figures.

FIG. 1 is a circuit representation of a NAND string.

FIG. 2 is a perspective view of a 3D stacked non-volatile memory device.

FIG. 4C depicts a cross-sectional view of a block of a 3D non-volatile memory device having straight strings.

FIG. 5A depicts a close-up view of the region 669 of the column C0 of FIG. 3B, showing a drain-side select gate SGD0 and a memory cell MC6,0.

FIG. 5B depicts a cross-sectional view of the column C0 of FIG. 5A.

FIG. 17A is a flowchart of one embodiment of a process of a read operation that measure the conduction current of a memory cell by the rate it discharges a dedicated capacitor in the sense amplifier.

FIG. 18A is a flowchart of one embodiment of a process of a read operation that senses how much voltage has discharged from a bit line.

FIG. 19A is a flowchart of one embodiment of a process of a program verify operation that measure the conduction current of a memory cell by the rate it discharges a dedicated capacitor in the sense amplifier.

DETAILED DESCRIPTION

Figure 3A:
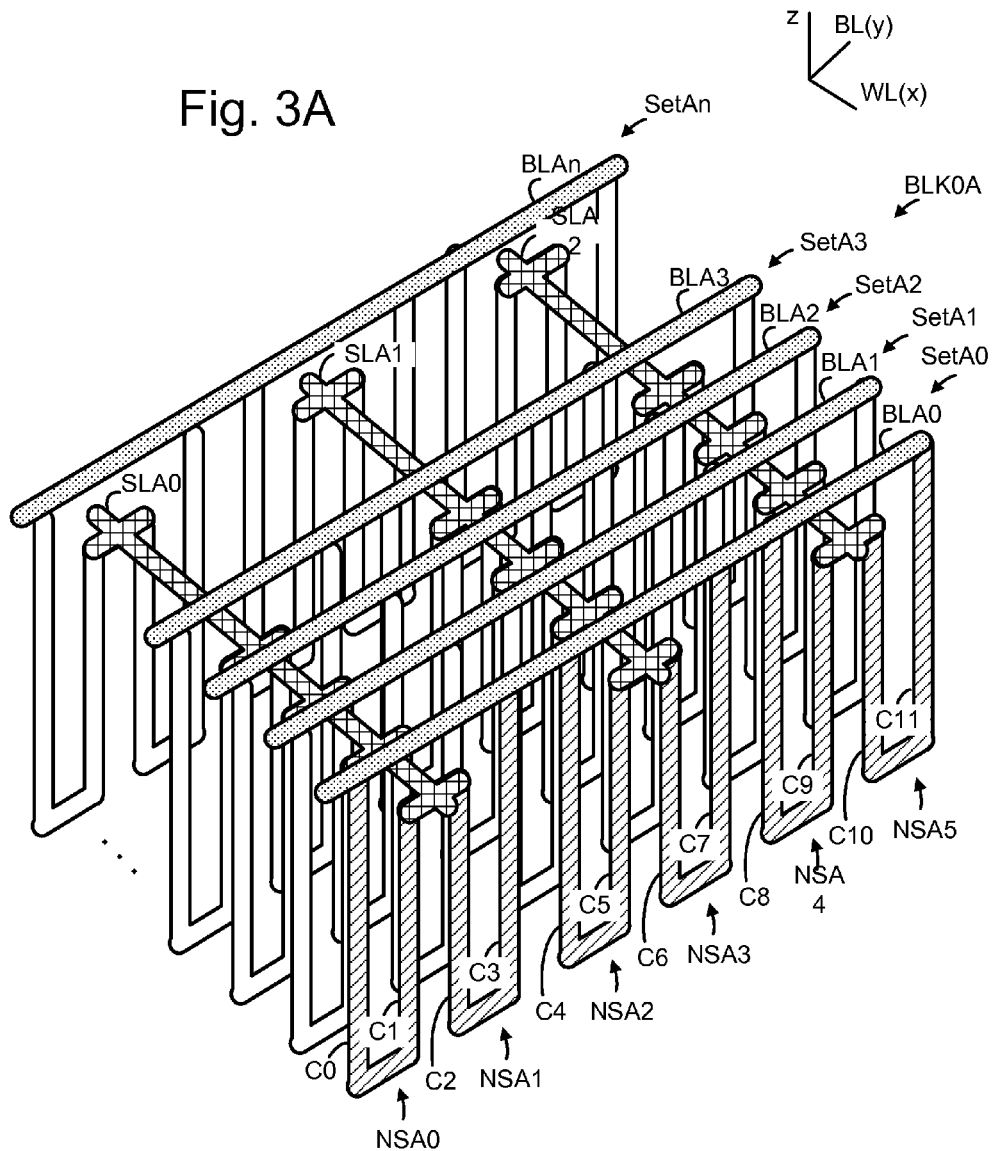
FIG. 3A depicts an embodiment of block BLK0 of FIG. 2 which includes U-shaped NAND strings.

A method and non-volatile storage system are provided in which the voltage applied to the source end of a NAND string depends on the location of the non-volatile storage element that is selected for sensing. This is done without body-biasing the NAND string, in one embodiment.

Applicants have noticed that certain failures depend on which word line is selected during a sensing operation. In one example, there are more failures when the selected memory cell is further from the source end of the NAND string. A possible explanation for this involves the resistance along the NAND string. Having the magnitude of the voltage applied to the source end of a NAND string depend on the location of the selected memory cell (without any body biasing) helps to mitigate failures that are dependent on which word line is selected during a sensing operation of one embodiment.

One example of a non-volatile storage system that can implement the technology described herein is a flash memory system that uses the NAND structure, which includes arranging multiple transistors in series, sandwiched between two select gates. The transistors in series and the select gates are referred to as a NAND string. FIG. 1 is a circuit representation of a NAND string. The NAND string depicted in FIG. 1 includes four transistors 100, 102, 104 and 106 in series and sandwiched between (drain side) select gate 120 and (source side) select gate 122. Select gate 120 connects the NAND string to a bit line 111. Select gate 122 connects the NAND string to source line 128. Note that the source line 128 may connect to many different NAND strings, although only one NAND string is depicted in FIG. 1. Select gate 120 is controlled by applying the appropriate voltages to select line SGD. Select gate 122 is controlled by applying the appropriate voltages to select line SGS.

Each of the transistors 100, 102, 104 and 106 has a control gate (CG) and a charge storage region (CSR). For example, transistor 100 has control gate 100CG charge storage region 1600CSR. Transistor 102 includes control gate 102CG and a charge storage region 102CSR. Transistor 104 includes control gate 104CG and charge storage region 104CSR. Transistor 106 includes a control gate 106CG and a charge storage region 106CSR. Control gate 100CG is connected to word line WL3, control gate 102CG is connected to word line WL2, control gate 104CG is connected to word line WL1, and control gate 106CG is connected to word line WL0.

Note that although FIG. 1 shows four memory cells in the NAND string, the use of four memory cells is only provided as an example. A NAND string can have fewer than four memory cells or more than four memory cells. The discussion herein is not limited to any particular number of memory cells in a NAND string. One embodiment uses NAND strings with some memory cells are used to store data and one or more of the memory cells are referred to as dummy memory cells because they do not store data.

A typical architecture for a flash memory system using a NAND structure will include many NAND strings. Each NAND string may be connected to the common source line by its source select gate controlled by select line SGS and connected to its associated bit line by its drain select gate controlled by select line SGD. Bit lines may be shared with multiple NAND strings. The bit line may be connected to a sense amplifier.

The charge storage region (CSR) may utilize a non-conductive dielectric material to store charge in a non-volatile manner. In one embodiment, a triple layer dielectric formed of silicon oxide, silicon nitride and silicon oxide ("ONO") is sandwiched between a conductive control gate and the memory cell channel. For example, the ONO may be $Al_2O_3$—SiN—$SiO_2$. In the direction from control gate toward the center of memory hole, the first oxide (e.g., $Al_2O_3$) is a blocking layer, which blocks un-desirable tunneling of electrons from CSR to control gate or from control gate to CSR. The silicon nitride is a charge trapping layer or charge storage region (CSR), in one embodiment. The second oxide (e.g., $SiO_2$) is tunneling dielectric through which electron can tunnel from the channel to the CSR during programming. The blocking layer can be a stack of dielectrics, e.g. $Al_2O_3$—$SiO_2$ in the direction from control gate toward the center of MH, in one embodiment. The tunneling layer can be a stack of different dielectric films, e.g. $SiO_2$—SiN—$SiO_2$, in one embodiment. The cell is programmed by injecting electrons from the cell channel (or NAND string channel) into the nitride, where they are trapped and stored in a limited region. This stored charge then changes the threshold voltage of the cell in a manner that is detectable. The cell may be erased by injecting holes into the nitride. Cells may be erased by injecting holes into the nitride where they recombine with electrons, and thereby "cancel" or reduce the stored charge. Cells may be also erased by extracting electrons from the nitride, e.g., by applying an electric field making electrons tunnel from nitride to the channel. Cells may be erased by both these mechanisms combined.

Numerous types of materials can be used for the charge storage regions (CSR). In one embodiment, the charge storage regions are conductive floating gates. As one example, the conductive floating gate is formed from polysilicon. This may be heavily doped polysilicon. Other types of non-volatile memory technologies can also be used.

FIG. 2 is a perspective view of a 3D stacked non-volatile memory device. The 3D memory device 200 includes a substrate 201. In one embodiment, the substrate 201 is formed from silicon. On the substrate are example blocks BLK0 and BLK1 of memory cells and a peripheral area 206 with circuitry for use by the blocks. The substrate 201 can also carry circuitry under the blocks, along with one or more lower metal layers which are patterned in conductive paths to carry signals of the circuitry. The blocks are formed in an intermediate region 202 of the memory device. The circuitry associated with operation of the memory cells may be above or within the substrate 201. In one embodiment, the non-volatile memory device is monolithically formed in one or more physical levels of arrays of memory cells having an active area disposed above the substrate 201.

In an upper region 203 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. An x-y-z coordinate system is depicted, showing a y-direction (or bit line (BL) direction), an x-direction (or word line (WL) direction), as well as a z-direction. While two blocks are depicted as an example, additional blocks can be used, extending in the x- and/or y-directions.

In one possible approach, the length of the plane, in the x-direction, represents a direction in which signal paths to word lines extend in the one or more upper metal layers, and the width of the plane, in the y-direction, represents a direction in which signal paths to bit lines extend in the one or more upper metal layers. The z-direction represents a height of the memory device.

In one embodiment, NAND strings have a U-shape. In another embodiment, NAND strings have a straight shape. FIG. 3A depicts an embodiment of block BLK0 of FIG. 2 which includes U-shaped NAND strings. The block BLK0A includes U-shaped NAND strings arranged in sets (SetA0, . . . , SetAn, where there are n+1 sets of NAND strings in a block). Each set of NAND strings is associated with one bit line (BLA0, BLA1, BLA2, BLA3, . . . , BLAn). In one embodiment, each NAND string has a drain side select gate that is able to connect/disconnect the NAND string from its bit line. The drain side select gates in a set of NAND strings may be individually selectable, such that one NAND string in the set may be selected at a given time. In one approach, all NAND strings in a block which are associated with one bit line are in the same set. Each U-shaped NAND string thus has two columns of memory cells—a drain-side column and a source-side column. For example, SetA0 includes NAND strings NSA0 (having drain-side column C0 and source-side column C1), NSA1 (having drain-side column C3 and source-side column C2), NSA2 (having drain-side column C4 and source-side column C5), NSA3 (having drain-side column C7 and source-side column C6), NSA4 (having drain-side column C8 and source-side column C9) and NSA5 (having drain-side column C11 and source-side column C10). Source lines extend transversely to the bit lines and include SLA0, SLA1 and SLA2. The source lines join the source-side columns of adjacent NAND string in a set. For example, SLA0 joins C1 and C2, SLA1 joins C5 and C6 and SLA2 joins C9 and C10. In one approach, the source lines in a block are joined to one another and driven by one driver. The bit lines and the source lines are above the memory cell array in this example.

Figure 3B:
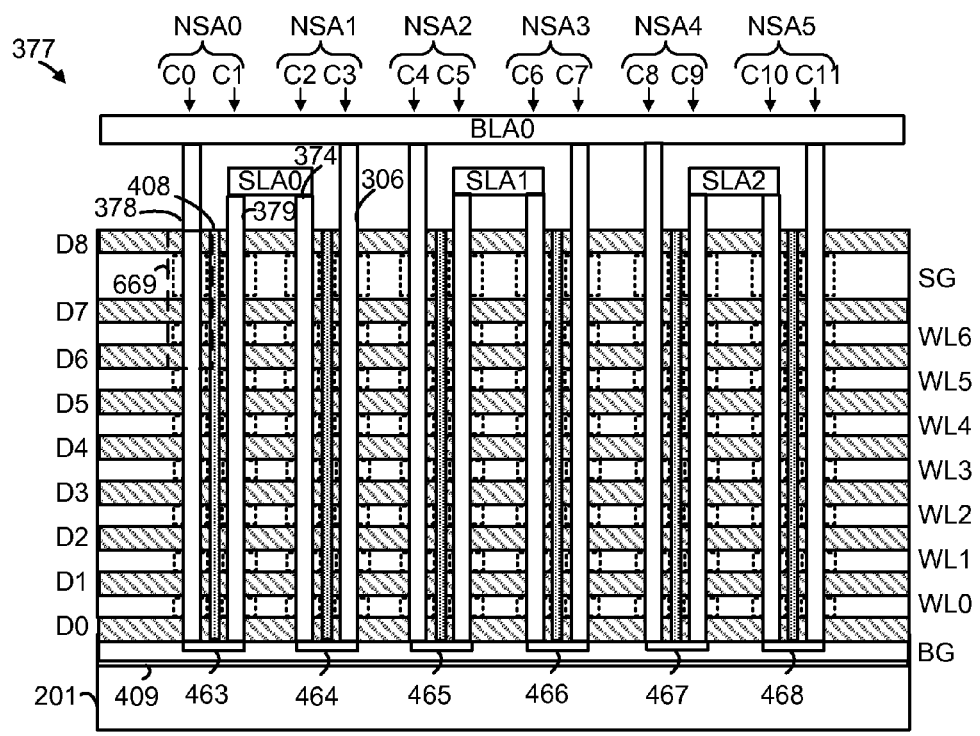
FIG. 3B depicts a cross-sectional view of a block of the 3D non-volatile memory device of FIG. 3A of SetA0 of NAND strings of FIG. 3A.

FIG. 3B depicts a cross-sectional view of a block of the 3D non-volatile memory device of FIG. 3A of SetA0 of NAND strings of FIG. 3A. Columns of memory cells C0 to C11 are depicted in the multi-layer stack. The stack 377 includes the substrate 201, an insulating film 409 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 463 to 468 which connect the columns. The back gate when properly biased, allows the back gate transistor to connect, through the pipe connection, thus connecting the two columns of each U-shaped NAND string. For example, NSA0 includes columns C0 and C1 and connecting portion 463. NSA0 has a drain end 378 and a source end 379. NSA1 includes columns C2 and C3 and connecting portion 464. NSA1 has a drain end 306 and a source end 374. NSA2 includes columns C4 and C5 and connecting portion 665. NSA3 includes columns C6 and C7 and connecting portion 466. NSA4 includes columns C8 and C9 and connecting portion 467. NSA5 includes columns C10 and C11 and connecting portion 468.

The source line SLA0 is connected to the source ends 379 and 374 of two adjacent memory strings NSA0 and NSA1, respectively, in the SetA0 of memory strings. The source line SLA0 is also connected to other sets of memory strings which are behind NSA0 and NSA1 in the x direction. Recall that additional U-shaped NAND strings in the stack 377 extend behind the U-shaped NAND strings depicted in the cross-section, e.g., along the x-axis. The U-shaped NAND strings NSA0 to NSA5 are each in a different sub-block, but are in a common set of NAND strings (SetA0).

A slit portion 408 is also depicted as an example. In the cross-section, multiple slit portions are seen, where each slit portion is between the drain- and source-side columns of a U-shaped NAND string. Portions of the source lines SLA0, SLAT, SLA2 are also depicted. A portion of the bit line BLA0 is also depicted.

Short dashed lines depict memory cells and select gates, as discussed further below. Thus, FIG. 3B shows strings (e.g., NAND strings) of non-volatile storage elements formed above the substrate 201 in multiple physical levels of a three-dimensional memory array. Each of the strings has an active area comprising a channel that extends vertically through the physical levels. Each string comprises non-volatile storage elements and a drain side select gate in the SG layer. A region 669 of the stack is shown in greater detail in FIG. 5A.

In one embodiment, the magnitude of the voltage that is applied to the common source lines SLA0, SLA1 and SLA2 during a sensing operation (e.g., read or program verify) depends on the location of the selected memory cell along the NAND string. For example, the farther that the selected memory cell is from the selected word line, the lower is the magnitude of the voltage to the common source line. However, some other relationship could be used. Additionally, the NAND strings are not body biased during the sensing operation, in one embodiment.

Figure 4A:
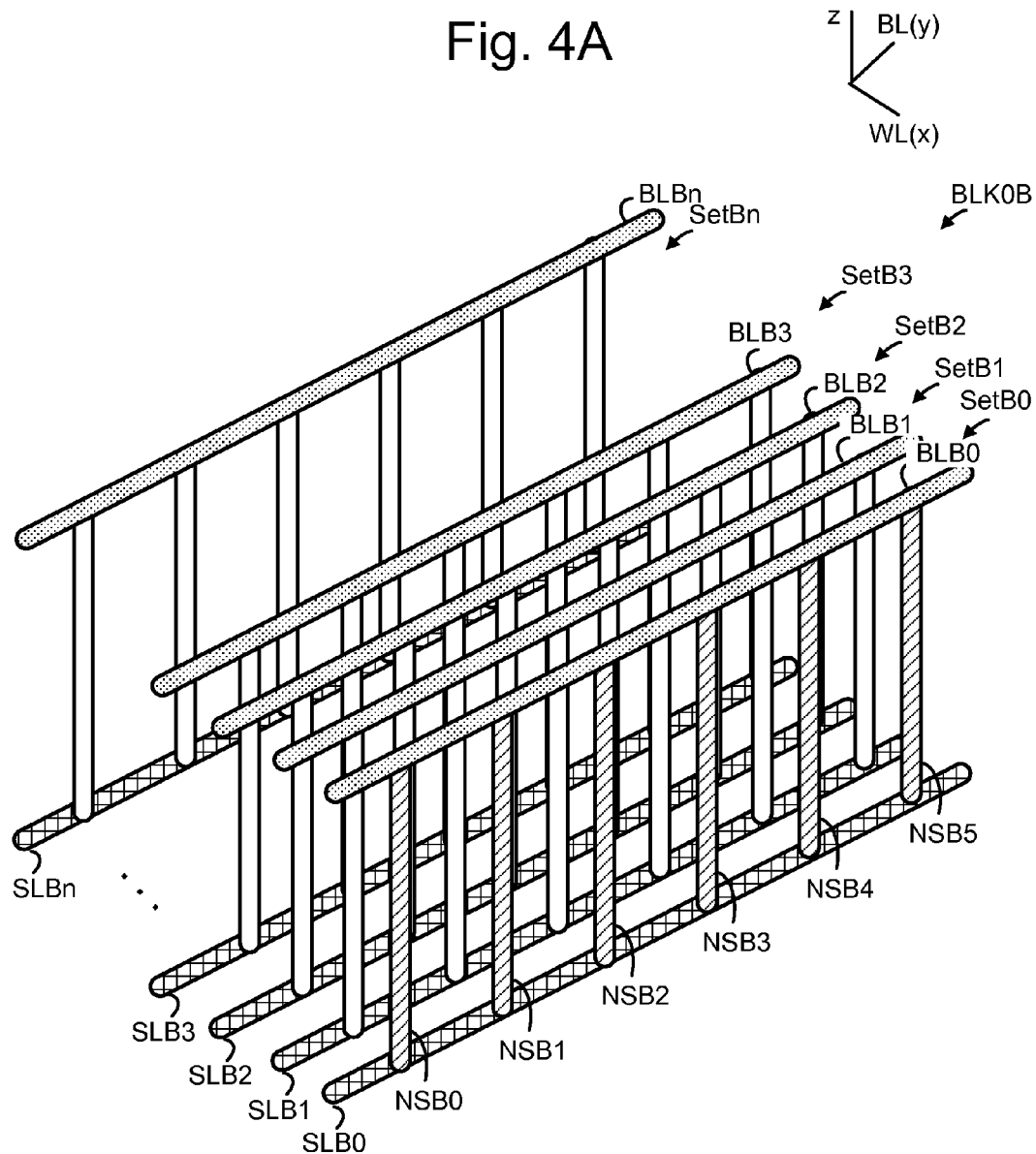
FIG. 4A depicts an embodiment of block BLK0 of FIG. 2 which includes straight NAND strings.

FIG. 4A depicts an embodiment of block BLK0 of FIG. 2 which includes straight NAND strings. The block BLK0B includes straight NAND strings arranged in sets (SetB0, SetB1, SetB2, SetB3, . . . , SetBn, where there are n+1 sets in a block). Each set of NAND strings is associated with one bit line (BLB0, BLB1, BLB2, BLB3, . . . , BLBn). In one approach, all NAND strings in a block which are associated with one bit line are in the same set. Each straight NAND string has one column of memory cells. For example, SetA0 includes NAND strings NSB0, NSB1, NSB2, NSB3, NSB4 and NSB5. Source lines extend parallel to the bit line and include SLB0, SLB1, SLB2, SLB3, . . . , SLBn. In one approach, the source lines in a block are joined to one another and driven by one driver. The bit lines are above the memory cell array and the source lines are below the memory cell array in this example.

Figure 4B:
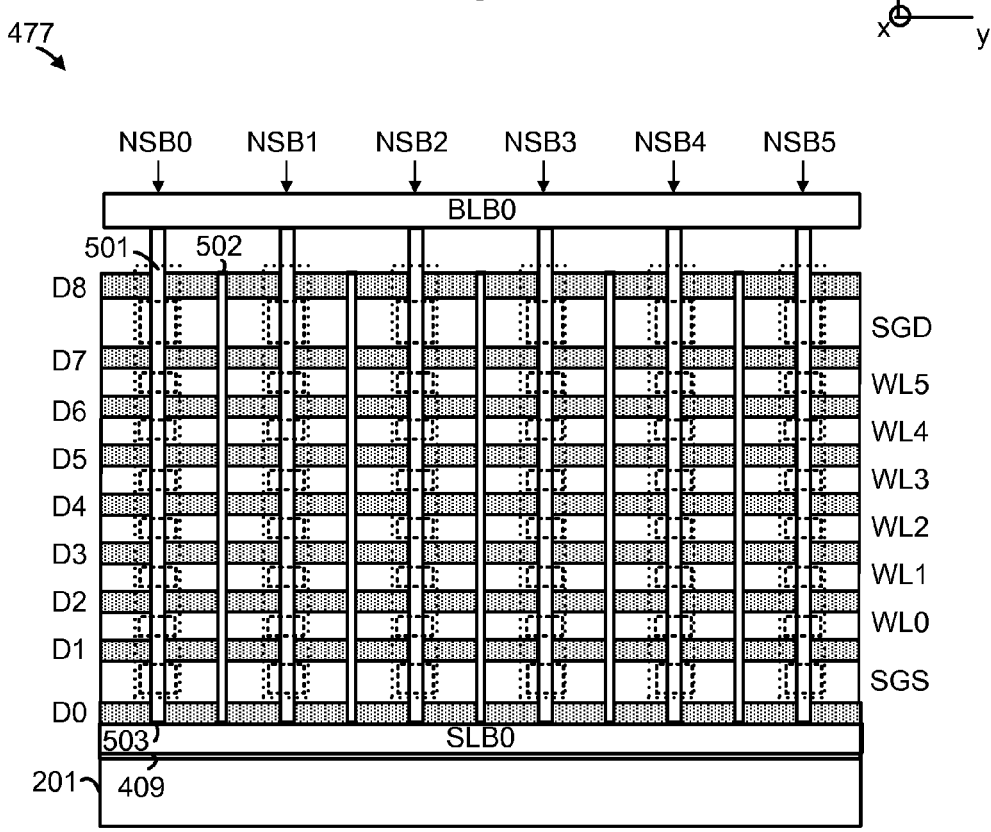
FIG. 4B depicts a cross-sectional view of a block of the 3D non-volatile memory device of FIG. 4A having straight strings.

FIG. 4B depicts a cross-sectional view of a block of the 3D non-volatile memory device of FIG. 4A having straight strings. The view of a portion of setB0 of NAND strings of FIG. 4A. Columns of memory cells corresponding to NAND strings NSB0 to NSB5, respectively, are depicted in the multi-layer stack. The stack 477 includes a substrate 201, an insulating film 409 on the substrate, and a portion of a source line SLB0. Recall that the additional straight NAND strings in a sub-block extend in front of and in back of the NAND strings depicted in the cross-section, e.g., along the x-axis. The NAND strings NSB0 to NSB5 are each in a different sub-block, but are in a common set of NAND strings (SetB0). NSB0 has a source end 503 and a drain end 501. A slit 502 is also depicted with other slits. A portion of the bit line BLB0 is also depicted. Dashed lines depict memory cells and select gates, as discussed further below.

In one embodiment, the magnitude of the voltage that is applied to the common source lines include SLB0, SLB1, SLB2, SLB3, . . . , SLBn during a sensing operation (e.g., read or program verify) depends on the location of the selected memory cell along the NAND string. For example, the farther that the selected memory cell is from the selected word line, the lower is the magnitude of the voltage to the common source line. However, some other relationship could be used. Additionally, the NAND strings are not body biased during the sensing operation, in one embodiment.

FIG. 4C depicts a cross-sectional view of a block of another embodiment of a 3D non-volatile memory device having straight strings. This embodiment differs from that of the embodiment of FIG. 4B in that the source end 503 of the NAND strings does not directly contact the source line. Instead, the source end 503 of the NAND string is in direct physical contact with the substrate 201. The substrate 201 may be silicon. The source line is not depicted in FIG. 4C.

FIG. 5A depicts a close-up view of the region 669 of the column C0 of FIG. 3B, showing a drain-side select gate SGD0 and a memory cell MC6,0. FIG. 5B depicts a cross-sectional view of the column C0 of FIG. 5A. The region 669 shows portions of the dielectric layers D6 to D8 and the conductive layers WL6 and SG. Each column includes a number of layers which are deposited along the sidewalls of the column. These layers can include oxide-nitride-oxide and silicon layers which may be formed using a variety of techniques. For example, atomic layer deposition could be used to deposit one or more of the layers. For example, a block oxide (or blocking layer) can be deposited as layer 696, a nitride such as SiN as a charge trapping layer (e.g., charge storage region CSR) can be deposited as layer 697, a tunnel oxide (or tunneling layer) can be deposited as layer 698, a silicon body or channel can be formed as layer 699. The innermost region is a silicon oxide core 695, which is optional. An alternative is for the silicon body 699 to form a solid core. However, fabrication of the device may be easier if the silicon oxide core 695 is used. The block oxide layer 696 and the tunnel oxide layer 698 may each be formed from several layers of different dielectric materials. In one embodiment, the block oxide layer 696 comprises a layer of $Al_2O_3$ and a layer of $SiO_2$ (the $Al_2O_3$ layer is closer to the word line than the $SiO_2$, in one embodiment). In one embodiment, the tunnel oxide layer 698 comprises a stack of oxide, nitride and oxide films. The semiconductor body or channel 699 may also be referred to as an active area. Additional memory cells are similarly formed throughout the columns.

Each layer 696-699 is shaped as a hollow cylinder in one possible approach. Region 695 is a silicon oxide core, in one possible approach. However, the core 695 is not a requirement. In one possible approach, the NAND string channel is a solid (i.e., not hollow cylinder) core. The horizontal cross section of the cylinders may be circular. However, it is not required that the horizontal cross section of the cylinders be circular. In one embodiment, the horizontal cross section of the cylinders is an ellipse. The horizontal cross section of the cylinders could deviate from a perfectly circular or perfectly elliptical shape. Also note that the size (e.g., width in the x-y plane) of the column can vary from top to bottom. Thus, the radius of the cylinders could vary from top to bottom. Thus, the term "cylindrical" as used herein does not require a constant radius from top to bottom. This, the term "cylindrical" as used herein allows for some tapering. Recall that region 669 of the column C0 of FIG. 3B is for the U-shaped 3D NAND string example. However, the diagrams and discussion for FIGS. 5A and 5B also apply to a straight 3D NAND string, such as the examples of FIGS. 4A-4C.

When a memory cell such as depicted in FIG. 5A is programmed, electrons are stored in a portion of the charge trapping layer which is associated with the memory cell. For example, electrons are represented by "-" symbols in the charge trapping layer 697 for MC6,0. These electrons are drawn into the charge trapping layer from the semiconductor body, and through the tunnel oxide. The threshold voltage of a memory cell is increased in proportion to the amount of stored charge.

During one embodiment of an erase operation, a voltage in the NAND channel may be raised due to GIDL, while a voltage of one or more selected word line layers floats. GIDL may occur due to high potential difference between bit line bias and drain side select gate bias (SGD), and similarly, between source line bias and source side select gate bias (SGS). The voltage of the one or more selected word line layers is then driven down sharply to a low level such as 0 V to create an electric field across the tunnel oxide which may cause holes to be injected from the memory cell's body to the charge trapping layer and recombine with electrons. Also, electrons can tunnel from the charge trapping layer to the positively biased channel. One or both of these mechanisms may work to remove negative charge from the charge trapping layer and result in a large Vth downshift toward an erase-verify level, Vv-erase. This process can be repeated in successive iterations until an erase-verify condition is met. For unselected word lines, the word lines may be floated but not driven down to a low level so that the electric field across the tunnel oxide is relatively small, and no, or very little, hole tunneling will occur. If word lines are floated, they will be electrically coupled to the NAND channel. As a result their potential will rise resulting in low potential difference between NAND channel and respective word lines. Memory cells of the unselected word lines will experience little or no Vth downshift, and as a result, they will not be erased. Other techniques may be used to erase.

Figure 5C:
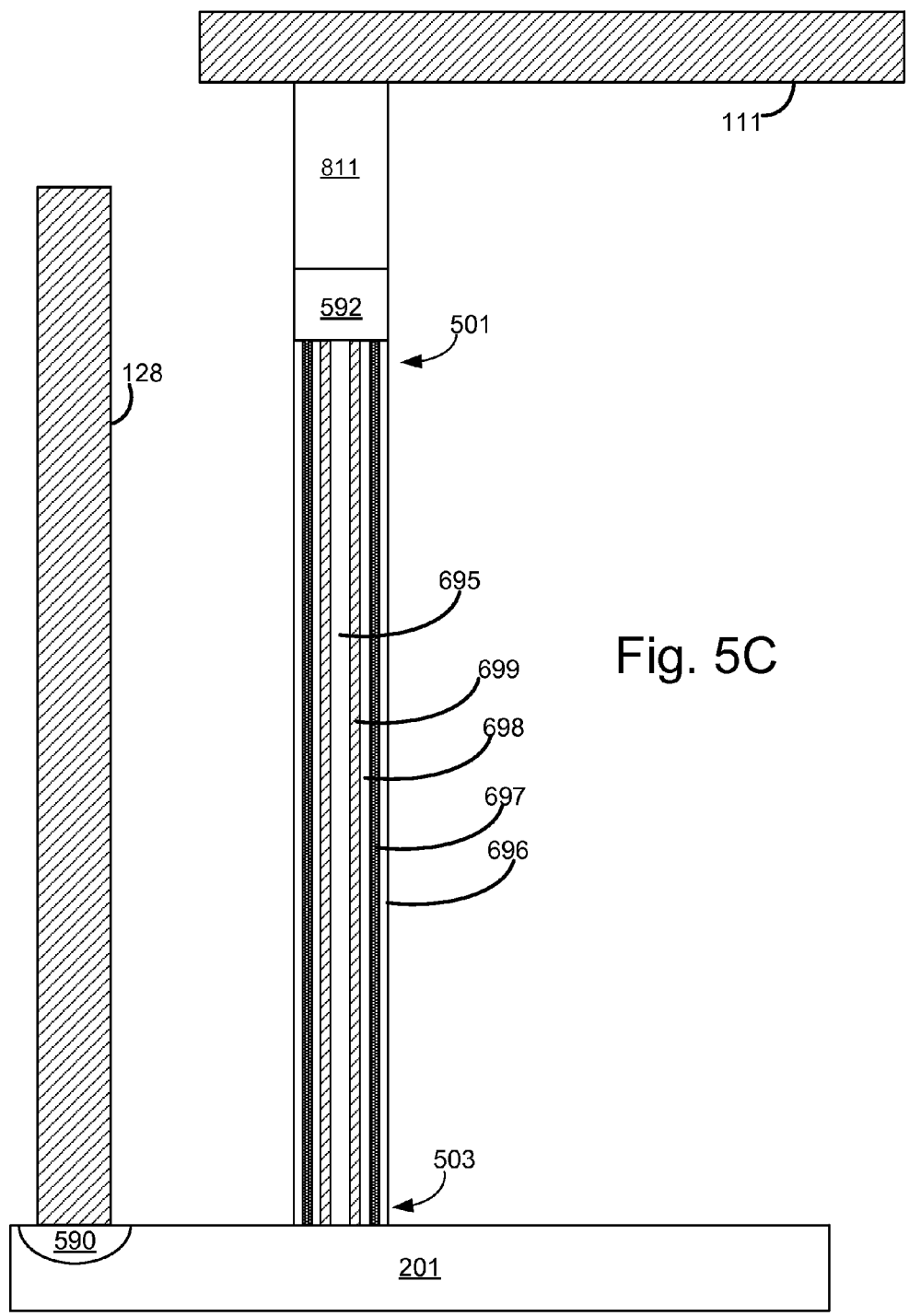
FIG. 5C depicts electrical connections between one embodiment of a silicon vertical NAND channel and a bit line and a source line.

FIG. 5C shows electrical connections between the silicon vertical NAND channel 699 and a bit line 111 and a source line 128 for one embodiment. The silicon channel 699 is in direct physical and direct electrical contact with the substrate 201, which may be formed from silicon. The source line 128 is in electrical contact with a source region 590 that is formed in the substrate 201. The source region 590 may be an n+ region. Thus, source region 590 can be formed by heavily doping a silicon substrate. The source line 128 is formed from metal, in one embodiment. Example metals include, but are not limited to, titanium, tungsten, copper, aluminum, and molybdenum. Note that the source line 128 may serve as a common source line for a number of NAND strings. For example, all of the NAND strings depicted in FIG. 4C may share a common source line.

The drain end 501 of the silicon NAND string channel 699 is in direct physical and electrical contact with a polysilicon plug 592. The bit line contact 811 is formed from metal, in one embodiment. Likewise, the bit line 111 is formed from metal, in one embodiment. Example metals for the bit line and bit line contact include, but are not limited to, titanium, tungsten, copper, aluminum, and molybdenum. Note that in this example, the channel 699 can be directly accessed by the bit line 111 (via the bit line contact 811 and polysilicon plug 592)

at the drain end 501, and the source line 128 (via the source region 590 and substrate 201. However, there is not an additional terminal for applying body bias to the NAND string channel 699, in this embodiment.

Figure 6:
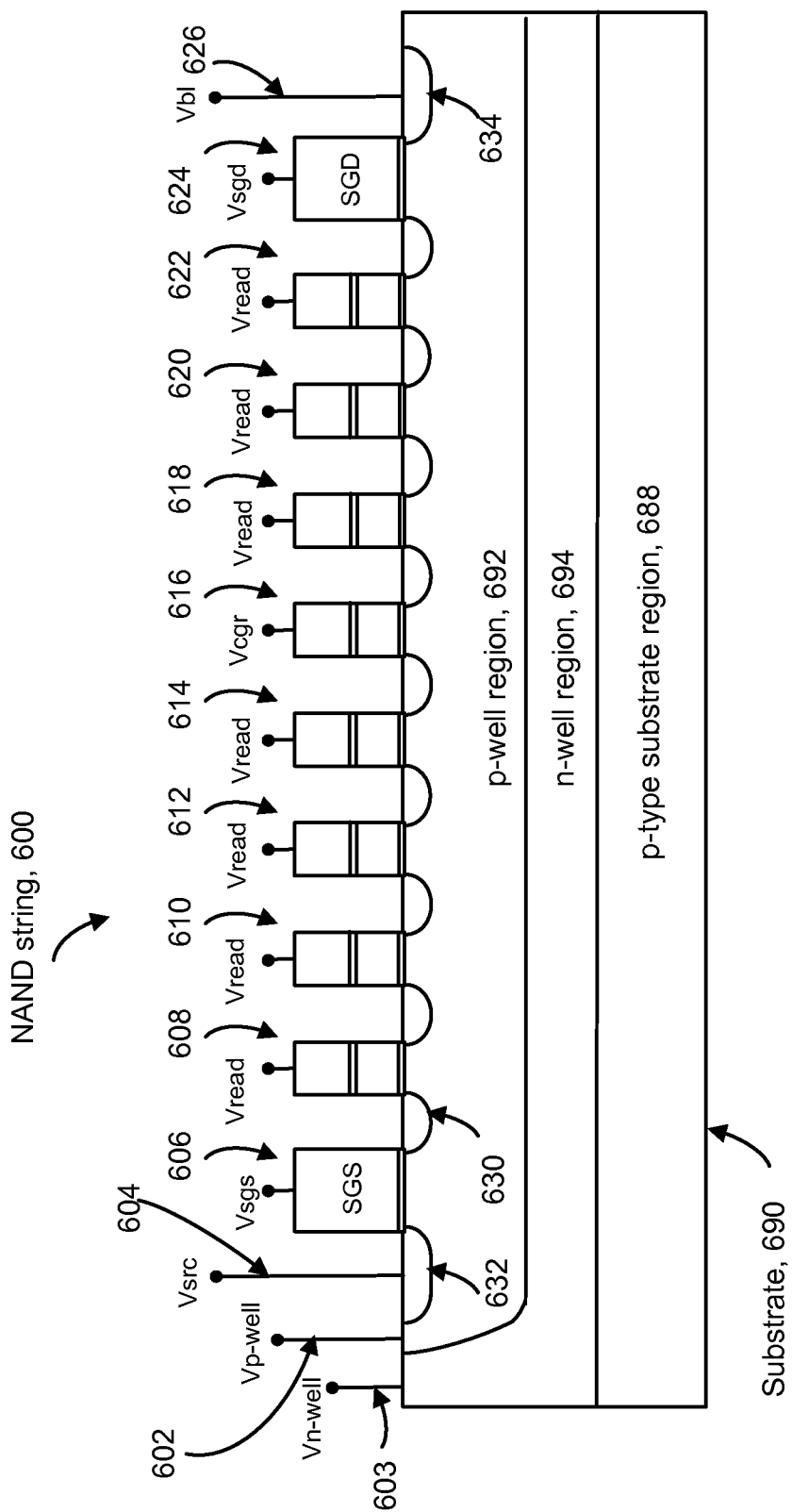
FIG. 6 depicts a cross-sectional view of an NAND string formed on a substrate.

FIG. 6 depicts a cross-sectional view of an NAND string formed on a substrate. This example is for a 2D NAND architecture. The view is simplified and not to scale. The NAND string 600 includes a source-side select gate 606, a drain-side select gate 624, and eight storage elements 608, 610, 612, 614, 616, 618, 620 and 622, formed on a substrate 690. A number of source/drain regions, one example of which is source drain/region 630, are provided on either side of each storage element and the select gates 606 and 624. In one approach, the substrate 690 employs a triple-well technology which includes a p-well region 692 within an n-well region 694, which in turn is within a p-type substrate region 688. The NAND string and its non-volatile storage elements can be formed, at least in part, on the p-well region.

A potential of Vsrc is provided to a source line contact 604. The source line contact 604 contacts a source side diffusion region 632 at one end of the NAND string 600. The other end of the source line contact 604 contacts the common source line (not depicted in FIG. 6). Thus, the potential of Vsrc may be applied to the source side diffusion region 632 of each NAND string that is connected to a common source line, by applying Vsrc to the common source line.

At the other end of the NAND string, a bit line contact 626 contacts a drain side diffusion region 634. A bit line voltage, Vbl is applied to the bit line contact via a bit line (not depicted in FIG. 6. The diffusion regions 632 and 634 may be heavily doped regions of the substrate 690. For example, doping could be similar to the source drain/regions 630.

In one possible approach, a voltage Vp-well can be applied to the p-well region 692 via a terminal 602. A voltage Vn-well can also be applied to the n-well region 694 via a terminal 603. In one embodiment, no body biasing is used. This can be achieved by applying the same voltage to one or both of the wells that is applied to the source line. Thus, in one embodiment, Vsrc is applied to both the source line contact 604 and p-well terminal 602. In one embodiment, Vsrc is applied to the source line contact 604, the p-well terminal 602, and the n-well terminal 603.

During a sensing operation such as a read or program verify operation, in which the condition of a storage element, such as its Vth, is ascertained, a control gate voltage (Vcgr) is provided on a selected word line which is associated with a selected storage element. Further, the control gate of a storage element may be provided as a portion of the word line. For example, WL0, WL1, WL2, WL3, WL4, WL5, WL6 and WL7 can extend via the control gates of storage elements 608, 610, 612, 614, 616, 618, 620 and 622, respectively. A read pass voltage, Vread, can be applied to unselected word lines associated with NAND string 600, in one possible scheme. The magnitude of Vread is sufficient to turn on the unselected memory cells. However, note that the magnitude of Vread can be different for the various unselected word lines. Vsgs and Vsgd are applied to the select gates 606 and 624, respectively.

In one embodiment of a sensing operation, the magnitude of Vsrc depends on how far the selected non-volatile storage element is from the source side diffusion region 632. As a practical matter, the magnitude of Vsrc may depend on which word line is selected.

Figure 7:
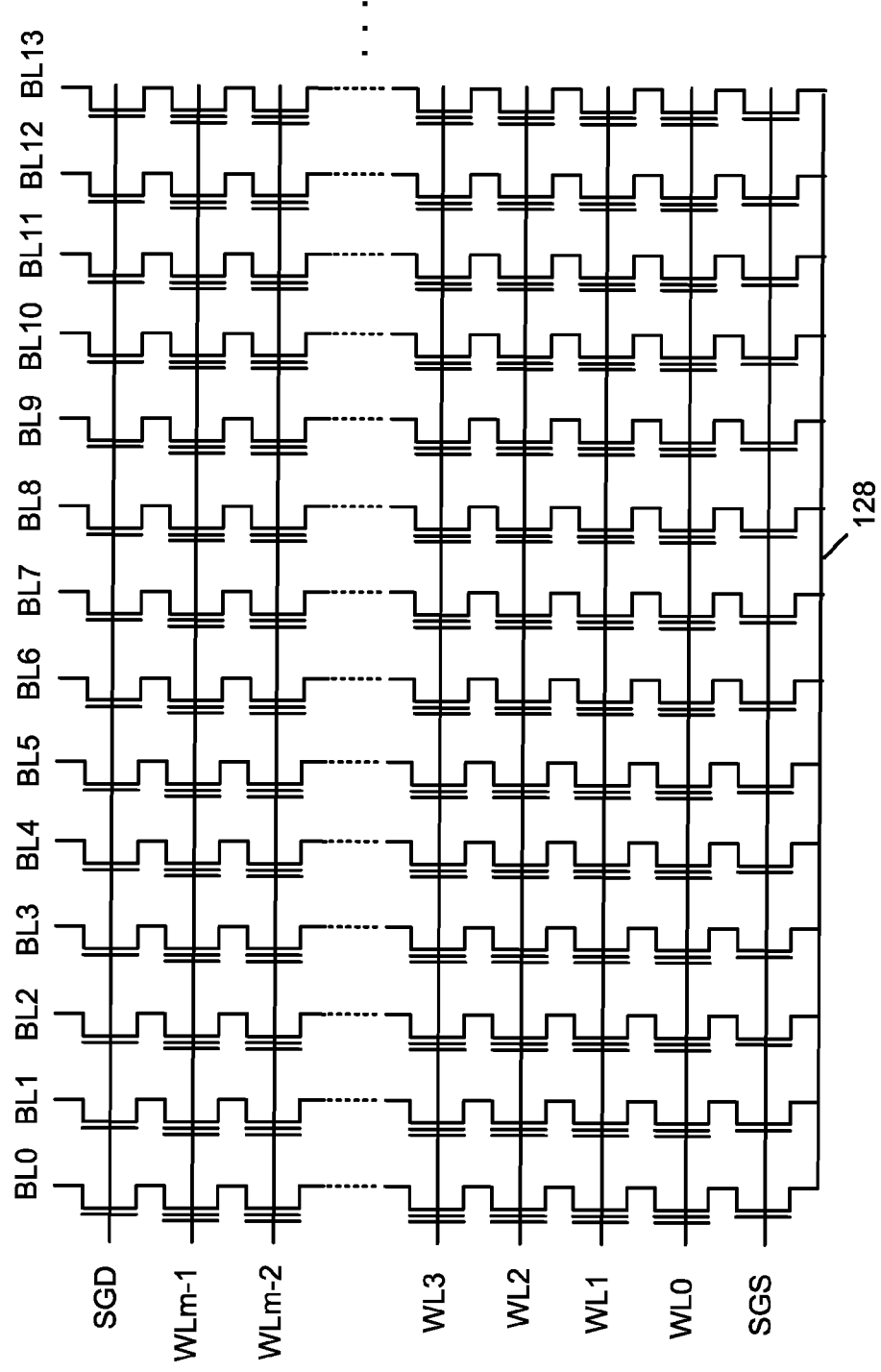
FIG. 7 depicts an example block in a memory array.

FIG. 7 depicts an example block in a memory array. The block includes example bit lines BL0, BL1, BL2, ... and m word lines WL0 through WLm−1. SGS represents a common control line for a source-side select gate, SGD represents a common control line for a drain-side select gate. A common source line 128 for the block connects to a terminal of each of the source side select gates (whose gates are connected to SGS). Note that the common source line 128 is switchably coupled (via the source side select gates) to many NAND strings. The example block could be for 2D NAND or 3D NAND. At the drain end, each NAND string is switchably coupled (via the drain side select gates whose gates are connected to SGD) to its respective bit line.

Figure 8:
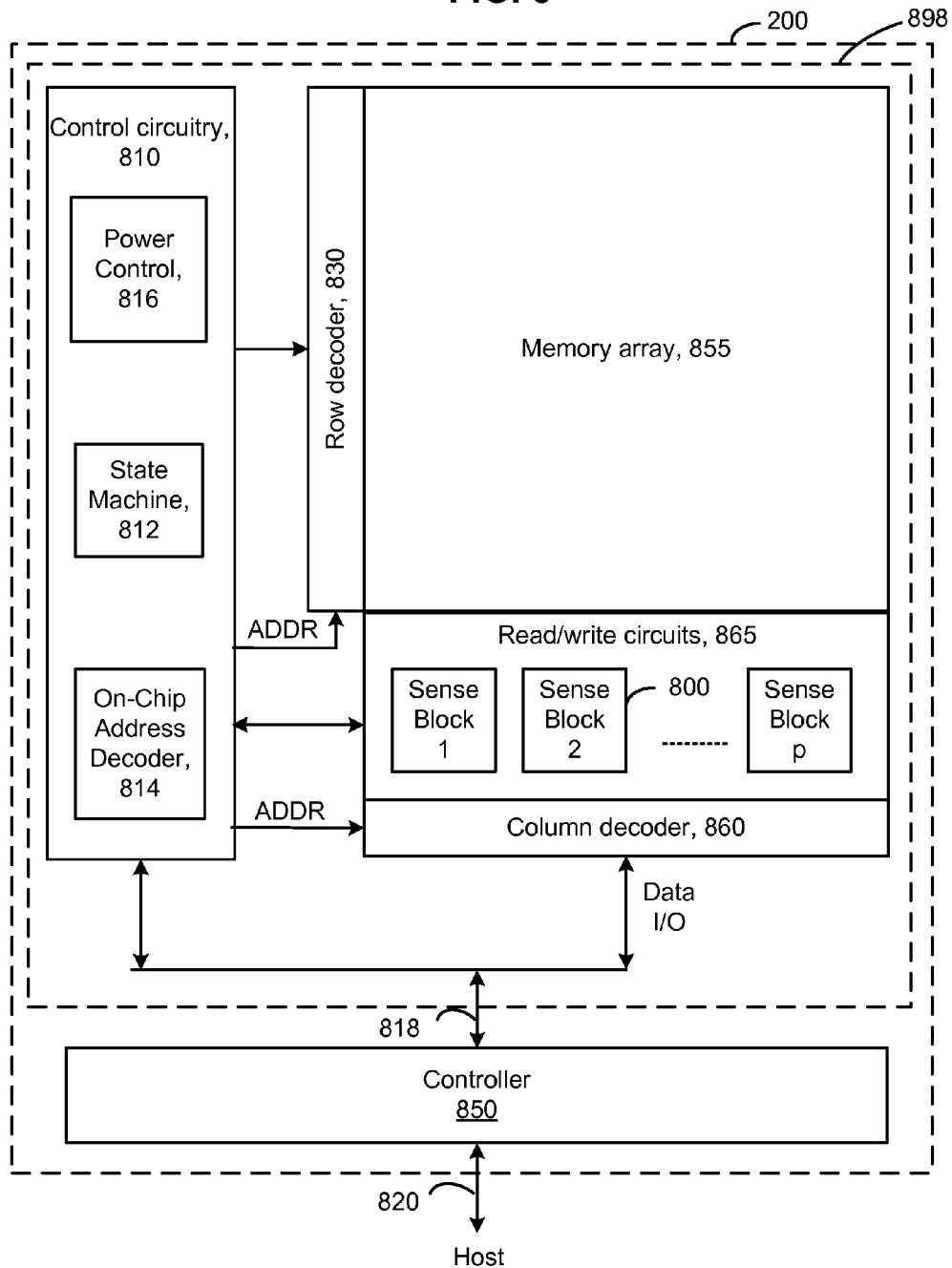
FIG. 8 is a block diagram of a non-volatile memory system using single row/column decoders and read/write circuits.

An example memory system which can be used is discussed next. FIG. 8 is a block diagram of a non-volatile memory system using single row/column decoders and read/write circuits. The diagram illustrates a memory device 200 having read/write circuits for reading and programming a page of storage elements in parallel, according to one embodiment. Memory device 200 may include one or more memory die 898. Memory die 898 includes a memory array of storage elements 855, control circuitry 810, and read/write circuits 865. The memory array 855 is discussed further in connection with FIG. 9. The memory array could be a two-dimensional memory array or a three-dimensional memory array. In one embodiment, the memory array 855 includes 2D NAND strings formed on a substrate, such as the example depicted in FIG. 6. In one embodiment, the memory array 855 includes 3D NAND strings formed above a substrate, such as the examples depicted in FIGS. 3B, 4B, 4C, etc.

The memory array 855 is addressable by word lines via a row decoder 830 and by bit lines via a column decoder 860. The read/write circuits 865 include multiple sense blocks 800 and allow a page of storage elements to be read or programmed in parallel. Typically a controller 850 is included in the same memory device 200 (e.g., a removable storage card) as the one or more memory die 898. Commands and data are transferred between the host and controller 850 via lines 820 and between the controller and the one or more memory die 898 via lines 818.

The control circuitry 810 cooperates with the read/write circuits 865 to perform memory operations on the memory array 855, and includes a state machine 812, an on-chip address decoder 814, and a power control module 816. The state machine 812 provides chip-level control of memory operations. The on-chip address decoder 814 provides an address interface between that used by the host or a memory controller to the hardware address used by the decoders 830 and 860. The power control module 816 controls the power and voltages supplied to the word lines and bit lines during memory operations.

In some implementations, some of the components of FIG. 8 can be combined. In various designs, one or more of the components (alone or in combination), other than memory array 855, can be thought of as a control circuit. For example, one or more control circuits may include any one of, or a combination of, control circuitry 810, state machine 812, decoders 814/160, power control 816, sense blocks 800 (including the processor 892 in FIG. 9), read/write circuits 865, and controller 850, etc. The sense block 800 is discussed further in connection with FIG. 9.

In another embodiment, a non-volatile memory system uses dual row/column decoders and read/write circuits. Access to the memory array 855 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the array 855. In this way, the density of the read/write modules is essentially reduced by one half.

Figure 9:
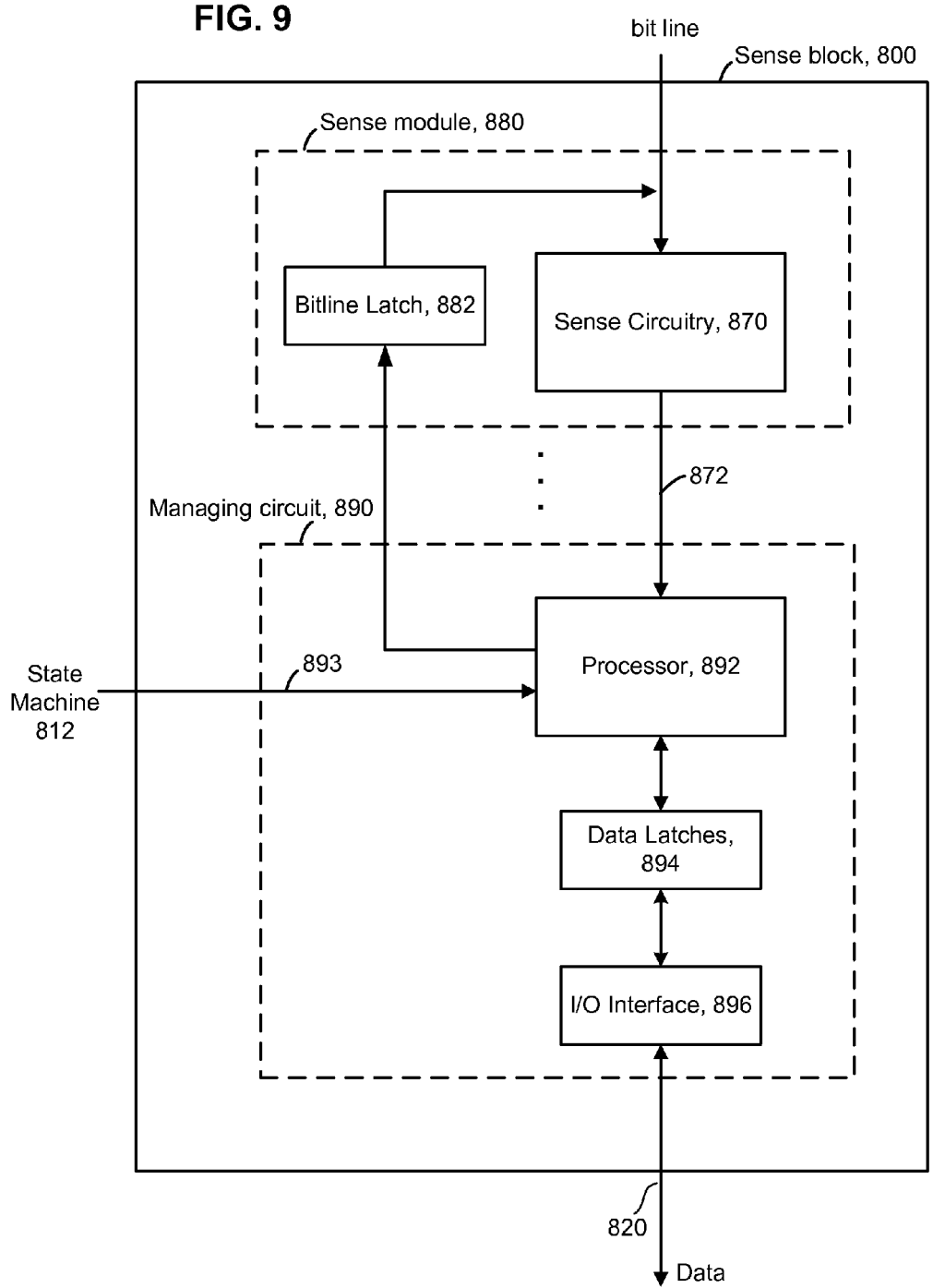
FIG. 9 is a block diagram depicting one embodiment of a sense block.

FIG. 9 is a block diagram depicting one embodiment of a sense block. An individual sense block 800 is partitioned into one or more core portions, referred to as sense modules 880 or sense amplifiers, and a common portion, referred to as a managing circuit 890. In one embodiment, there will be a separate sense module 880 for each bit line and one common managing circuit 890 for a set of multiple, e.g., four or eight, sense modules 880. Each of the sense modules in a group communicates with the associated managing circuit via data bus 872. Thus, there are one or more managing circuits which communicate with the sense modules of a set of storage elements.

Sense module 880 comprises sense circuitry 870 that determines whether a conduction current in a connected bit line is above or below a predetermined threshold level. Sense module 880 also includes a bit line latch 882 that is used to set a voltage condition on the connected bit line. For example, a predetermined state latched in bit line latch 882 will result in the connected bit line being pulled to a state designating program inhibit (e.g., 8.5-3 V). As an example, a value of FLG=0 can inhibit programming, while FLG=1 does not inhibit programming.

Managing circuit 890 comprises a processor 892, a set of data latches 894 and an I/O Interface 896 coupled between the set of data latches 894 and data bus 820. Processor 892 performs computations, such as to determine the data stored in the sensed storage element and store the determined data in the set of data latches. The set of data latches 894 is used to store data bits determined by processor 892 during a read operation, and to store data bits imported from the data bus 820 during a program operation. The imported data bits represent write data intended to be programmed into the memory. I/O interface 896 provides an interface between data latches 894 and the data bus 820.

During reading, the operation of the system is under the control of state machine 812 that controls the supply of different control gate voltages to the addressed storage element. As it steps through the one or more various predefined control gate voltages corresponding to the various memory states supported by the memory, the sense module 880 may trip at one of these voltages and an output will be provided from sense module 880 to processor 892 via bus 872. At that point, processor 892 determines the resultant memory state by consideration of the tripping event(s) of the sense module and the information about the applied control gate voltage from the state machine via input lines 893. It then computes a binary encoding for the memory state and stores the resultant data bits into data latches 894. In another embodiment, bit line latch 882 serves double duty, both as a latch for latching the output of the sense module 880 and also as a bit line latch as described above.

Some implementations can include multiple processors 892. In one embodiment, each processor 892 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 892 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 894 from the data bus 820. The program operation, under the control of the state machine, comprises a series of programming voltage pulses applied to the control gates of the addressed storage elements. Each program pulse is followed by a read back (verify) to determine if the storage element has been programmed to the desired memory state. In some cases, processor 892 monitors the read back memory state relative to the desired memory state. When the two are in agreement, the processor 892 sets the bit line latch 882 so as to cause the bit line to be pulled to a state designating program inhibit. This inhibits the storage element coupled to the bit line from further programming even if program pulses appear on its control gate. In other embodiments the processor initially loads the bit line latch 882 and the sense circuitry sets it to an inhibit value during the verify process.

Data latch stack 894 contains a stack of data latches for each sense module. In one embodiment, there are three data latches per sense module 880. In some implementations, the data latches are implemented as a shift register so that the parallel data stored therein is converted to serial data for data bus 820, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 10A:
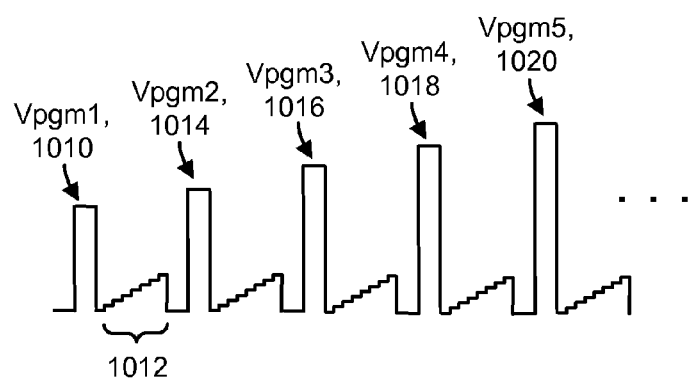
FIG. 10A depicts a voltage waveform applied to the control gates of storage elements during a program operation.

FIG. 10A depicts a voltage waveform applied to the control gates of storage elements during a program operation. The waveform or pulse train includes program pulses 1010, 1014, 1016, 1018 and 1020 . . . , and a set of verify pulses between each program pulse, including a set of example verify pulses 1012, shown in FIG. 10B. The program pulses can be fixed in amplitude, or they can step up by a fixed or varying step size, for instance. When each verify pulse is applied, a verify operation is performed for selected storage elements which are to be programmed to a particular target data state which is associated with the verify pulse, to evaluate the storage element's Vth relative to the verify voltage. A program-verify operation or iteration include a program pulse and the following set of verify pulses.

In one embodiment, the programming pulses have a voltage which starts at an initial level such as 12 V and increases by increments, e.g., 0.5 V, for each successive programming pulse until a maximum of, e.g., 20-25 V is reached. In some embodiments, there can be a verify pulse for each state that data is being programmed into, e.g., state A, B, C . . . . In other embodiments, there can be more or fewer verify pulses. For example, verify pulses may be provided only for state A initially, then for states A and B, then for states B and C and so forth. The waveform may be used during all bit line programming, for instance, in which storage elements of even- and odd-numbered bit lines are programmed together, and verified together. Or, the verify operation can be performed separately, e.g., first for the even-numbered bit lines and then for the odd-numbered bit lines.

Figure 10B:
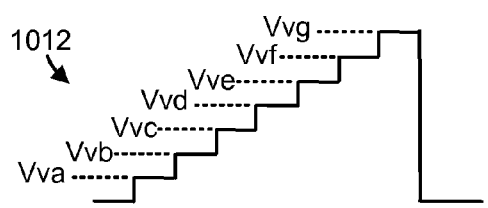
FIG. 10B depicts a voltage waveform applied to the control gates of storage elements during a program verify operation.

FIG. 10B depicts a voltage waveform 1012 applied to the control gates of storage elements during a program verify operation. In an example eight-state embodiment, control gate voltages such as Vva, Vvb, Vvc, Vvd, Vve, Vvf and Vvg can be applied. A verify process for a storage element which is intended to be programmed so that its Vth exceeds a certain control gate voltage, involves applying the control gate voltage and sensing whether the NAND string is in a conductive state. If the NAND string is in a conductive state, the Vth is below the control gate voltage and the storage element will continue to be programmed in the next program-verify operation. If the NAND string is in a non-conductive state, the Vth is above the control gate voltage and the storage element will be locked out from further programming in the next program-verify operation. Note that it is not required that every state is verified following each program pulse. In some embodiments, the programming process involves multiple phases certain state(s) are programmed in one phase and other state(s) are programmed in another phase. Moreover, verify of one or more of the states can be skipped after a program pulse. For example, verify of the higher threshold voltages states might be skipped for the first few program pulses.

Figure 10C:
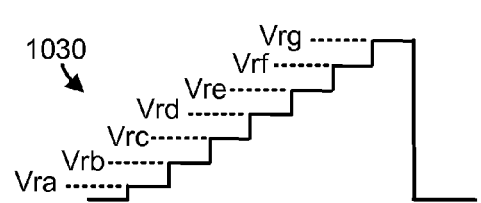
FIG. 10C depicts a voltage waveform applied to the control gates of storage elements during a read operation.

FIG. 10C depicts a voltage waveform 1030 applied to the control gates of storage elements during a read operation. For example, control gate voltages such as Vra, Vrb, Vrc, Vrd, Vre, Vrf and Vrg can be applied. A read process for a storage element involves determining the read levels which bound the Vth of the storage element. Or, only one bounding read level need be determined if the storage element is in the erased state or the highest programmed state. In one approach, the control gate read voltages are applied in turn to a word line, starting from the lowest control gate read voltage. At the first sensing operation in which it is determined that the NAND string has reached a conductive state, the Vth is below the control gate voltage and it can be concluded that the storage element is in a data state which is directly below the read level. For example, if the NAND string is first conductive when Vre is applied to a selected word line, we conclude that the associated storage element is in the D state. In this case, the NAND string is non-conductive when Vra through Vrd are applied to the selected word line.

The signals of FIGS. 10A, 10B, and 10C are used for 2D NAND in one embodiment. The signals of FIGS. 10A, 10B, and 10C are used for 3D NAND in one embodiment.

Figure 11A:
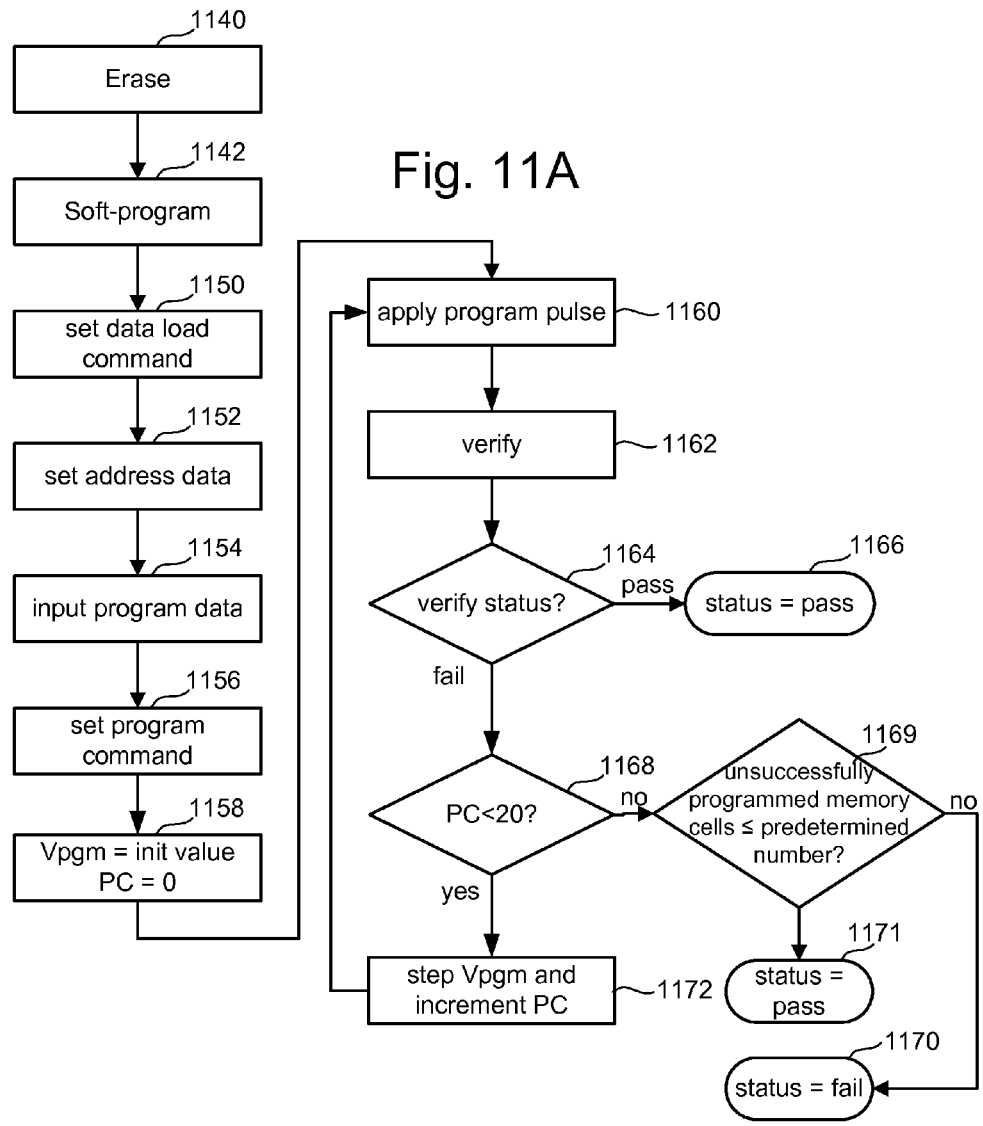
FIG. 11A is a flow chart describing one embodiment of a method for programming non-volatile memory.

FIG. 11A is a flow chart describing one embodiment of a method for programming non-volatile memory. In one embodiment, this process is used to program 2D NAND. In one embodiment, this process is used to program 3D NAND. The series of program pulses (vpgm1, vpgm2, etc.) in FIG. 10A may be used. The memory cells to be programmed are erased at step 1140. Step 1140 can include erasing more memory cells than those to be programmed (e.g., in blocks or other units). Step 1140 includes performing an erase verify. In one embodiment, erase conditions that reduce current and/or power consumption are applied during erase verify.

At step 1142, soft-programming is performed to narrow the distribution of erased threshold voltages for the erased memory cells. Some memory cells may be in a deeper erased state than necessary as a result of the erase process. Soft-programming can apply small programming pulses to move the threshold voltage of the erased memory cells closer to the erase verify level. At step 1150 of FIG. 11A, a "data load" command is issued by controller 850 and input to command circuits, allowing data to be input to data input/output buffer. At step 1152, address data designating the page address is input to row controller or decoder 814 from the controller or host. The input data is recognized as the page address and latched via state machine 812, affected by the address latch signal input to command circuits. At step 1154, a page of program data for the addressed page is input to data input/output buffer for programming. For example, 512 bytes of data could be input in one embodiment. That data is latched in the appropriate registers for the selected bit lines. In some embodiments, the data is also latched in a second register for the selected bit lines to be used for verify operations. At step 1156, a "program" command is issued by the controller and input to data input/output buffer. The command is latched by state machine 812 via the command latch signal input to command circuits.

Triggered by the "program" command, the data latched in step 1154 will be programmed into the selected memory cells controlled by state machine 812 using the stepped pulses of FIG. 11A applied to the appropriate word line. At step 1158, Vpgm, the programming pulse voltage level applied to the selected word line, is initialized to the starting pulse (e.g., 12V) and a program counter PC maintained by state machine 812 is initialized at 0. At step 1160, the first Vpgm pulse is applied to the selected word line. If logic "0" is stored in a particular data latch indicating that the corresponding memory cell should be programmed, then the corresponding bit line is grounded. On the other hand, if logic "1" is stored in the particular latch indicating that the corresponding memory cell should remain in its current data state, then the corresponding bit line is connected to VDD to inhibit programming.

At step 1162, the states of the selected memory cells are verified. FIG. 10B shows a series of verify reference voltages that are applied to the selected word line, in one embodiment. In this example, the memory cells store each store three bits, such that verify reference levels Vva-Vvg are used. However, as noted above, it is not required that every state be verified following each program pulse.

If it is detected that the target threshold voltage of a selected cell has reached the appropriate level, then the data stored in the corresponding data latch is changed to a logic "1." If it is detected that the threshold voltage has not reached the appropriate level, the data stored in the corresponding data latch is not changed. In this manner, a bit line having a logic "1" stored in its corresponding data latch does not need to be programmed. When all of the data latches are storing logic "1," the state machine knows that all selected cells have been programmed. At step 1164, it is checked whether all of the data latches are storing logic "1." If so, the programming process is complete and successful because all selected memory cells were programmed and verified to their target states. A status of "PASS" is reported at step 1166.

If, at step 1164, it is determined that not all of the data latches are storing logic "1," then the programming process continues. At step 1168, the program counter PC is checked against a program limit value. One example of a program limit value is 20, however, other values can be used in various implementations. If the program counter PC is not less than 20, then it is determined at step 1169 whether the number of bits that have not been successfully programmed is equal to or less than a predetermined number. If the number of unsuccessfully programmed bits is equal to or less than the predetermined number, then the programming process is flagged as passed and a status of pass is reported at step 1171. The bits that are not successfully programmed can be corrected using error correction during the read process. If however, the number of unsuccessfully programmed bits is greater than the predetermined number, the program process is flagged as failed and a status of fail is reported at step 1170. If the program counter PC is less than 20, then the Vpgm level is increased by the step size and the program counter PC is incremented at step 1172. After step 1172, the process loops back to step 1160 to apply the next Vpgm pulse.

The flowchart of FIG. 11A depicts a one pass of a programming method. This could be the only pass of a single pass process or one pass of a multi-pass process. As one example, a single pass could be applied for binary storage. A two-pass programming method can be applied for multi-level storage. For a two-pass programming method, steps 1158-1172 may be performed for each pass of the programming operation. One example of a two-pass programming process programs memory cells to an intermediate state in a first pass and to final states in a second pass. In the first pass, one or more program pulses may be applied and the results thereof verified to determine if a cell is in the appropriate intermediate state. In the second pass, one or more program pulses may be applied and the results thereof verified to determine if the cell is in the appropriate final state.

Figure 11B:
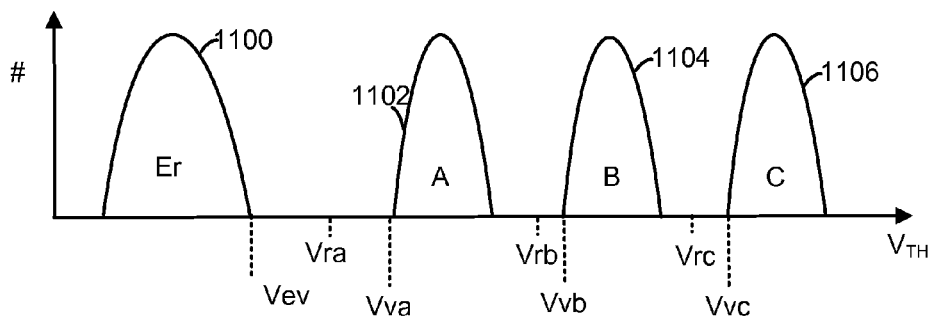
FIG. 11B illustrates exemplary threshold voltage distributions for a memory cell array when each memory cell stores two bits of data in four physical states.

At the end of a successful program process, the threshold voltages of the memory cells should be within one or more distributions of threshold voltages for programmed memory cells or within a distribution of threshold voltages for erased memory cells. FIG. 11B illustrates exemplary threshold voltage distributions for a memory cell array when each memory cell stores two bits of data in four physical states. Distribution 1100 represents a distribution of threshold voltages of cells that are in an erased state (storing "11"), which may have negative threshold voltage levels. Distribution 1102 represents a distribution of threshold voltages of cells that are in a first programmed state ("A"), storing "10." Distribution 1104 represents a distribution of threshold voltages of cells that are in a second programmed state ("B), storing "00." Distribution 1106 represents a distribution of threshold voltages of cells that are in a third programmed state ("C"), storing "01." In one embodiment, each memory cell stores a single bit. In this case, there are only two threshold distributions.

When programming the memory cells, they may be verified using program verify reference levels Vva, Vvb, and Vvc, for the A-C states respectively. When reading the memory cells, the read reference level Vra may be used to determine whether memory cells at the A-state distribution or higher. Likewise, Vrb and Vrc are read reference levels for the B- and C-states, respectively. An erase verify level (Vev) is also depicted.

Figure 11C:
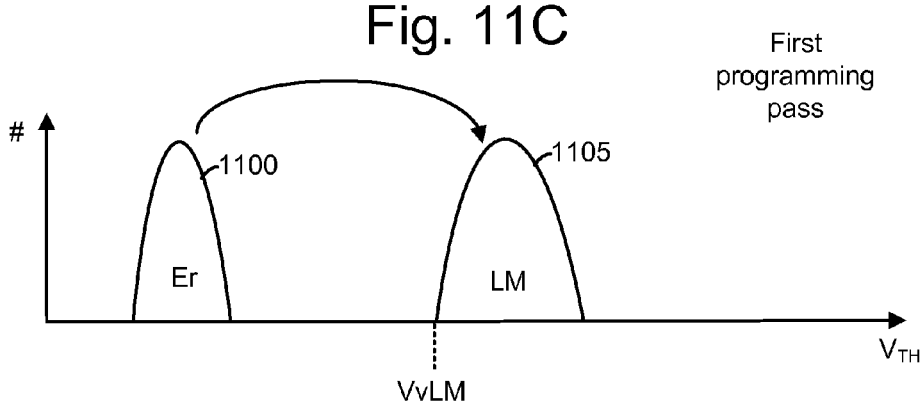
FIGS. 11C and 11D depict a two pass programming sequence in accordance with one embodiment.
Figure 11D:
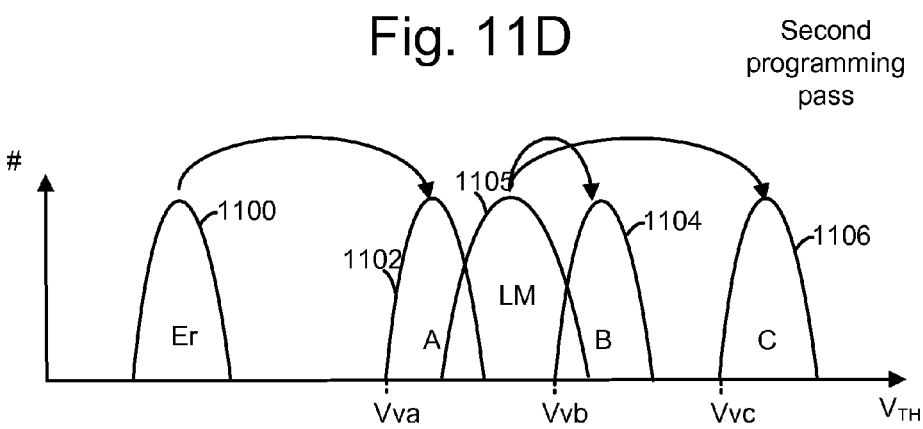

FIGS. 11C and 11D depict a two pass programming sequence in accordance with one embodiment. In the first pass, the lower page is programmed. In the second pass the upper page is programmed. As depicted in FIG. 11C, in the first pass storage elements intended for either the B- or C-states are programmed to an intermediate state 1105. The intermediate state 1105 has a verify level of VvLM.

As depicted in FIG. 11D, in the second pass programming to the A-, B-, and C-states is completed. Storage elements targeted for the A-state are programmed from the Er-state 1100 to the A-state 1102. Storage elements targeted for the B-state are programmed from the LM-state 1105 to the B-state 1104. Storage elements targeted for the C-state are programmed from the LM-state 1105 to the C-state 1106.

Of course, if the memory is operated with more than four physical states then there will be a number of threshold voltage distributions within the defined voltage threshold window of the memory cells that is equal to the number of states. Further, although specific bit patterns have been assigned to each of the distributions or physical states, different bit patterns may be assigned.

Applicants have noticed that certain failures are dependent on which word line is selected during a sensing operation. One type of failure is referred to as an E-to-A failure. This refers to a case in which a memory cell that should be in the erased state (E) is sensed as being in the A-state.

Figure 12A:
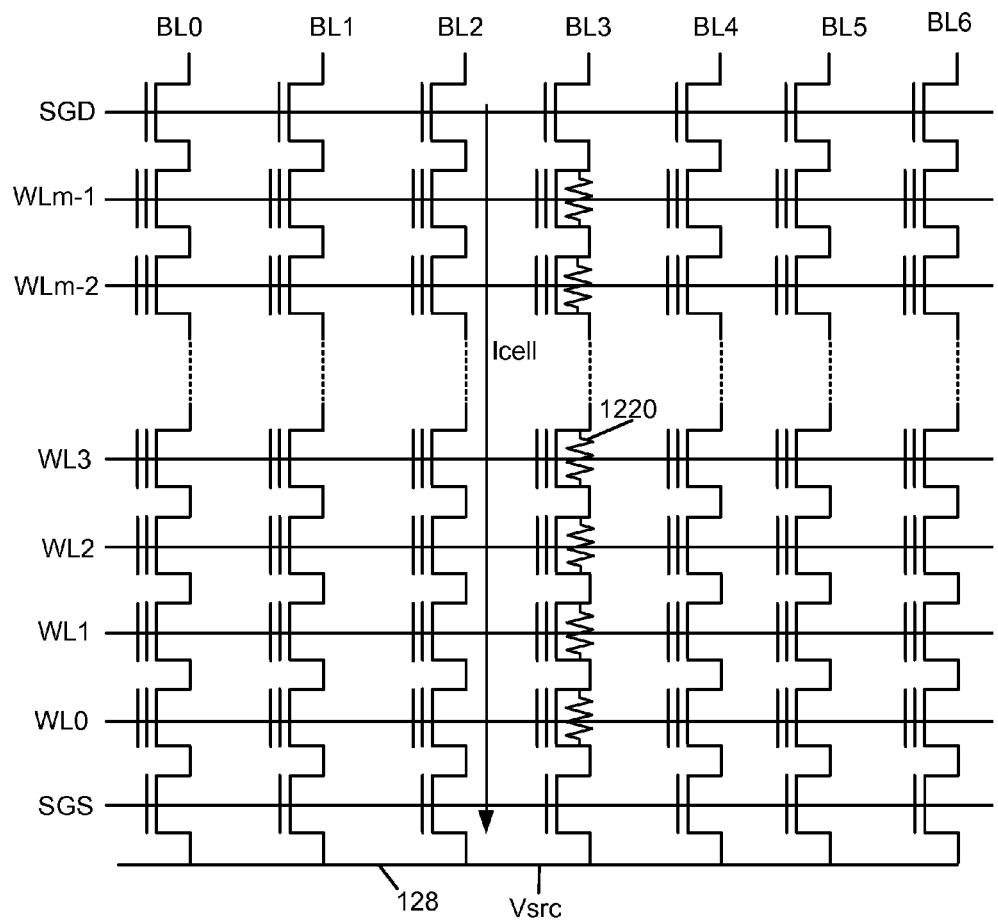
FIG. 12A shows a source side resistance model.

In one example, there are more failures when the selected memory cell is further from the source end of the NAND string. A possible explanation for this involves the resistance along the NAND string. FIG. 12A shows a source side resistance model. The diagram depicts a schematic representation of several NAND strings. The source end of each NAND string is connected to the common source line 128 via the source side select gates. The drain end of each NAND string is connected to its own bit line (BL0-BL6) via the drain side select gates. Each NAND string is associated with one of the word lines (WL0-WLm−1). For one of the NAND strings, some resistive elements 1220 are depicted. The resistive elements 1220 represent resistance of the channel of the NAND string.

During a sensing operation, such as a read operation or a program verify operation, the voltage Vsrc is applied to the common source line 128. During typical sensing operations, the voltage on the bit line is greater than the voltage on the common source line 128. A reference voltage is applied to the word line whose memory cells are selected for sensing. Other word lines may have a read pass voltage applied thereto. A current Icell is depicted for one of the NAND strings. The magnitude of the current will depend on the condition (e.g., threshold voltage) of the selected memory cell.

Figure 12B:
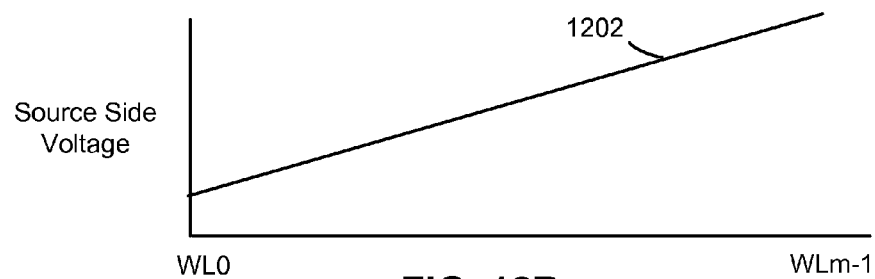
FIG. 12B shows "source side voltage" versus selected word line for one embodiment.

Since there is some resistance 1220 along the NAND string, there will be some increase in the voltage Vsrc moving along the NAND string from the source line 128 to the bit line (with the assumed direction of Icell). This means that the location of the selected memory cell along the NAND string has an impact on the magnitude of Vsrc it experiences. For example, a selected memory cell near the bit line may experience a greater magnitude Vsrc than one near the common source line 128. This relationship is depicted in FIG. 12B, which shows "source side voltage" versus selected word line. The source side voltage refers to the voltage on the source side of a given selected memory cell. For example, referring to FIG. 6, the source side voltage for the memory cell with Vcgr applied to its gate refers to the voltage at the source drain/region 630 on the source side of that memory cell.

A higher source side voltage may result in a worse sub-threshold slope, higher neutral threshold voltage, fewer electrons programmed into the charge storage region (e.g., floating gate). Such factors could indirectly lead to worse E-to-A failures, or other failures.

This problem may become worse with more erase/program cycles. A possible explanation for this pattern is that charges can become trapped along the NAND string during program and/or erase operations. These charges can increase the resistance along the NAND string. Thus, the resistance 1220 along the NAND string can become worse with more erase/program cycles (also known as "write/erase" cycles).

The foregoing problems can occur when storing one-bit per memory cell or when storing multiple bits per memory cell. The foregoing problems can occur with 2D NAND, 3D NAND, but are not limited thereto.

In one embodiment, the voltage that is applied to the common source line 128 during a sensing operation has a magnitude that depends on the location of the selected memory cell along the NAND string. The sensing operation is a read operation in one embodiment. The sensing operation is a program verify operation in one embodiment. This may compensate for the aforementioned source side resistance problem.

Figure 13:
FIG. 13 is a diagram that depicts one embodiment of a dependence of the voltage applied to the common source line during a sensing operation with respect to location of the selected memory cell.

FIG. 13 is a diagram that depicts one embodiment of a dependence of the voltage applied to the common source line during a sensing operation with respect to location of the selected memory cell. In this example, as the selected memory cell is further from the source end of the selected NAND string, the magnitude of Vsrc drops (as shown by curve 1302). In this example, four different zones are used. However more or fewer zones might be used. The zones could each be the same size or could be of different sizes (in terms of number of memory cells in the zone).

Figure 14:
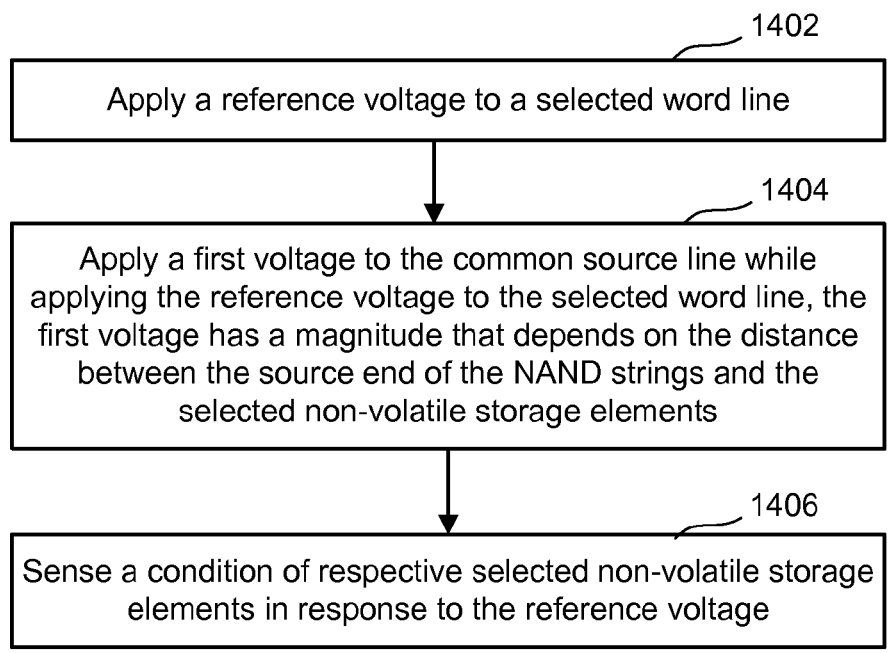
FIG. 14 is a flowchart depicting one embodiment of a process for sensing memory cells.

FIG. 14 is a flowchart depicting one embodiment of a process for sensing memory cells. This process is used in 2D NAND, in one embodiment. This process is used in 3D NAND, in one embodiment.

Step 1402 includes applying a reference voltage to a selected word line. This could be a read reference voltage such as Vra, Vrb, Vrc (see FIG. 11B), a verify voltage such as Vva, Vvb, Vvc (see FIG. 11B), but it not so limited. As noted, a first end of each of the NAND strings is connected to a common source line via a source side select gate, in one embodiment. The voltage has a magnitude that depends on the distance between a source end of the respective NAND strings and the respective selected non-volatile storage elements. FIG. 13 shows an example of this dependence. Step 1402 is not limited to this example.

Step 1404 includes applying a voltage to the common source line while applying the reference voltage to the selected word line. The voltage applied to the common source line does not result in body bias to the NAND strings, in one embodiment. This is achieved by applying the same voltage to the substrate in which 2D NAND strings are formed, in one embodiment. For example, referring to FIG. 6, Vsrc is applied to the source line contact 604 and also to the p-well terminal 602. Additionally, Vsrc may also be applied to the n-well terminal 603.

In one embodiment, the voltage applied to the common source line results in the same amount of back- (or body-) bias to the NAND strings regardless of the distance between the source end of the respective strings and the respective selected non-volatile storage elements. In other words, the voltage to the substrate (e.g., p-well) is not required to the same as the voltage to the commons source line, but the difference between the two should be the same regardless of the position of the selected word line.

Step 1406 includes sensing a condition of respective selected non-volatile storage elements on the NAND strings that are associated with the selected word line in response to the reference voltage. Various embodiments of the process of FIG. 14 are discussed below in connection with FIGS. 17A-20B.

During a sensing operation, in addition to the reference voltage applied to the selected word line, a read pass voltage (e.g., Vread) is typically applied to unselected word lines. The read pass voltage has sufficient magnitude such that the unselected memory cells will turn on. It is not required that the magnitude of the read pass voltage be the same for all unselected word lines. In one embodiment, the magnitude of the read pass voltage on at least some of the unselected word lines depends on the location of the selected memory cell along the NAND string.

Figure 15:
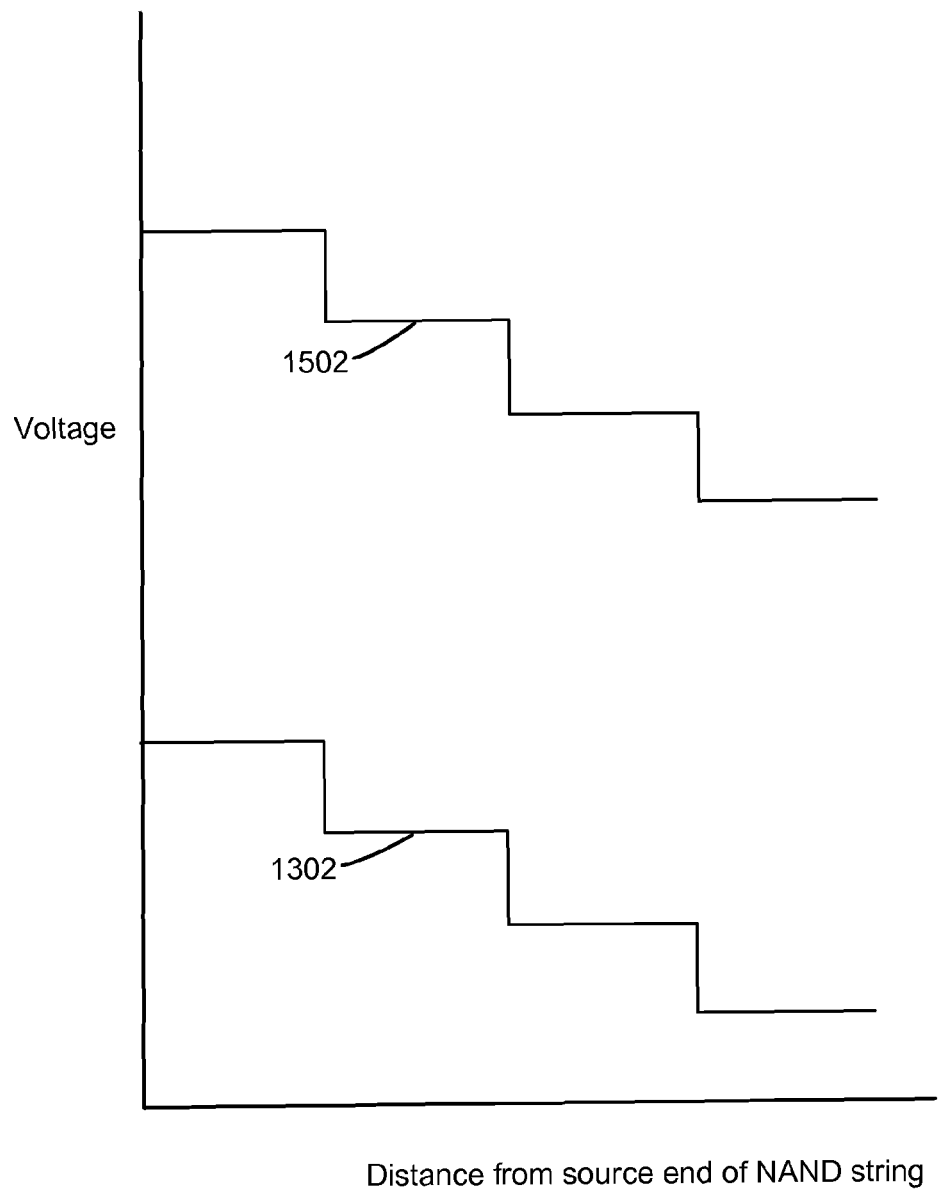
FIG. 15 is a diagram that shows one embodiment of common source line voltage and a read pass voltage versus distance of the selected memory cell from the source end of the NAND string.

FIG. 15 is a diagram that shows one embodiment of common source line voltage and a read pass voltage versus distance of the selected memory cell from the source end of the NAND string. Curve 1302 is for the common source line voltage, and has already been discussed. Curve 1502 is for the read pass voltage (Vread). In this example, there are four zones for each voltage. Moreover, the four zones for each voltage cover the exact same memory cells, in this embodiment.

Furthermore, the read pass voltage moves in the same direction as the common source line voltage. Thus, Vread drops the further the selected memory cell is from the source end of the NAND string, in this embodiment. In one embodiment, Vread drops by the same amount that Vsrc drops with distance from the source end of the NAND string. Thus, the difference between Vread and Vsrc is kept the same, in one embodiment.

Figure 16A:
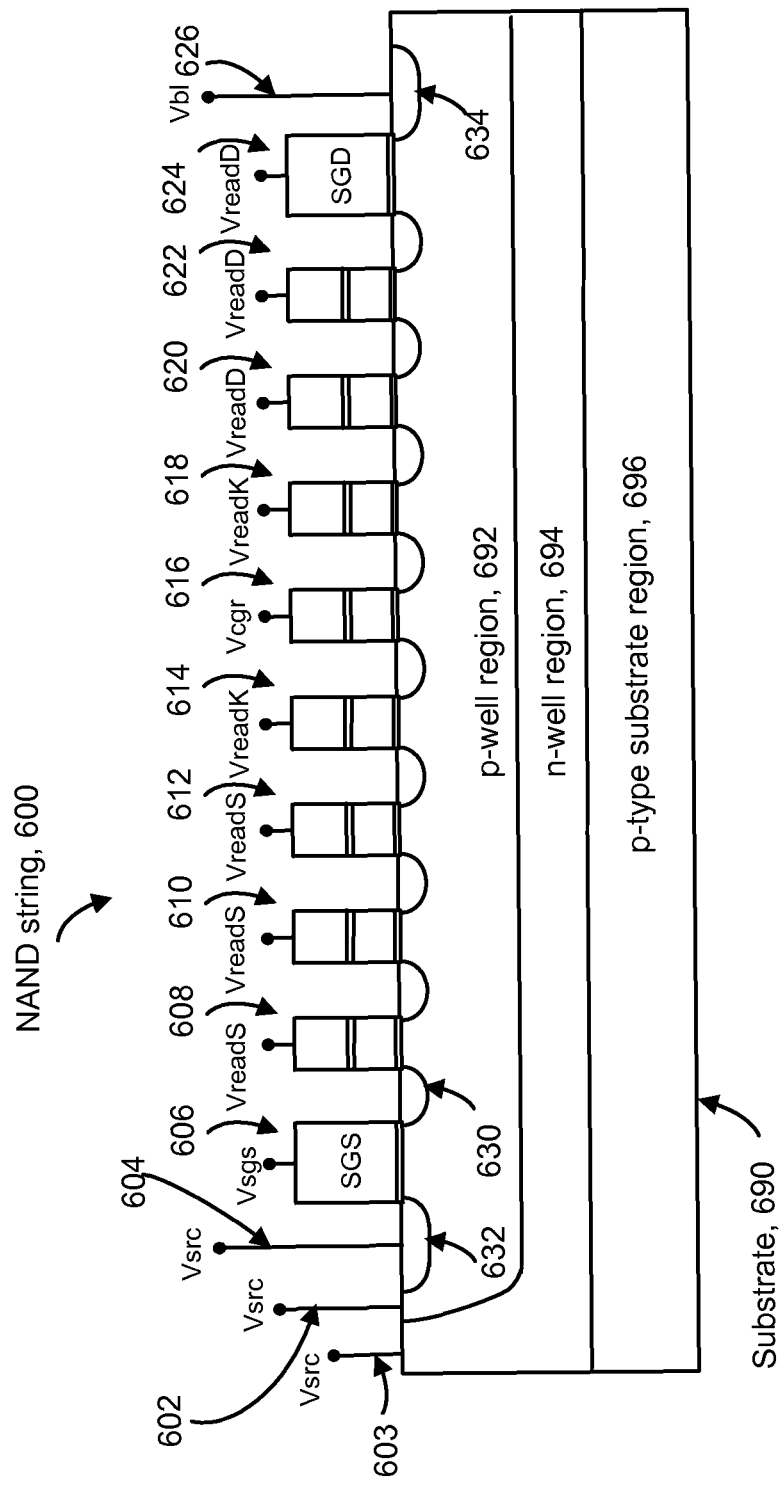
FIG. 16A shows one example of a scheme of read pass voltages applied to a NAND string during a read operation.

FIG. 16A shows one example of a scheme of read pass voltages applied to a NAND string during a read operation. In this scheme, there are three different read pass voltages. A first read pass voltage, VreadS, is applied between the source end of the NAND string and the second neighbor to the selected memory cell on the source side. A second read pass voltage, VreadK, is applied to each neighbor to the selected memory cell. A third read pass voltage, VreadR, is applied between the drain end of the NAND string and the second neighbor to the selected memory cell on the drain side.

The magnitude of VreadS that is applied to each of the unselected memory cells during a read operation may be the same for a particular sensing operation. However, the magnitude of VreadS during read operations depends on the location of the selected memory cell, in one embodiment. The magnitude of VreadS during read operations may drop as the selected memory cell is further from the source end of the NAND string. Such an example relationship was depicted in FIG. 15.

The magnitude of VreadD that is applied to each of the unselected memory cells may be the same for a particular sensing operation. However, the magnitude of VreadD during read operations depends on the location of the selected memory cell, in one embodiment. The magnitude of VreadD during read operations may drop as the selected memory cell is further from the source end of the NAND string. Such an example relationship was depicted in FIG. 15.

The magnitude of VreadK during read operations could be the same regardless of the position of the selected memory cell, although this is not a requirement.

Figure 16B:
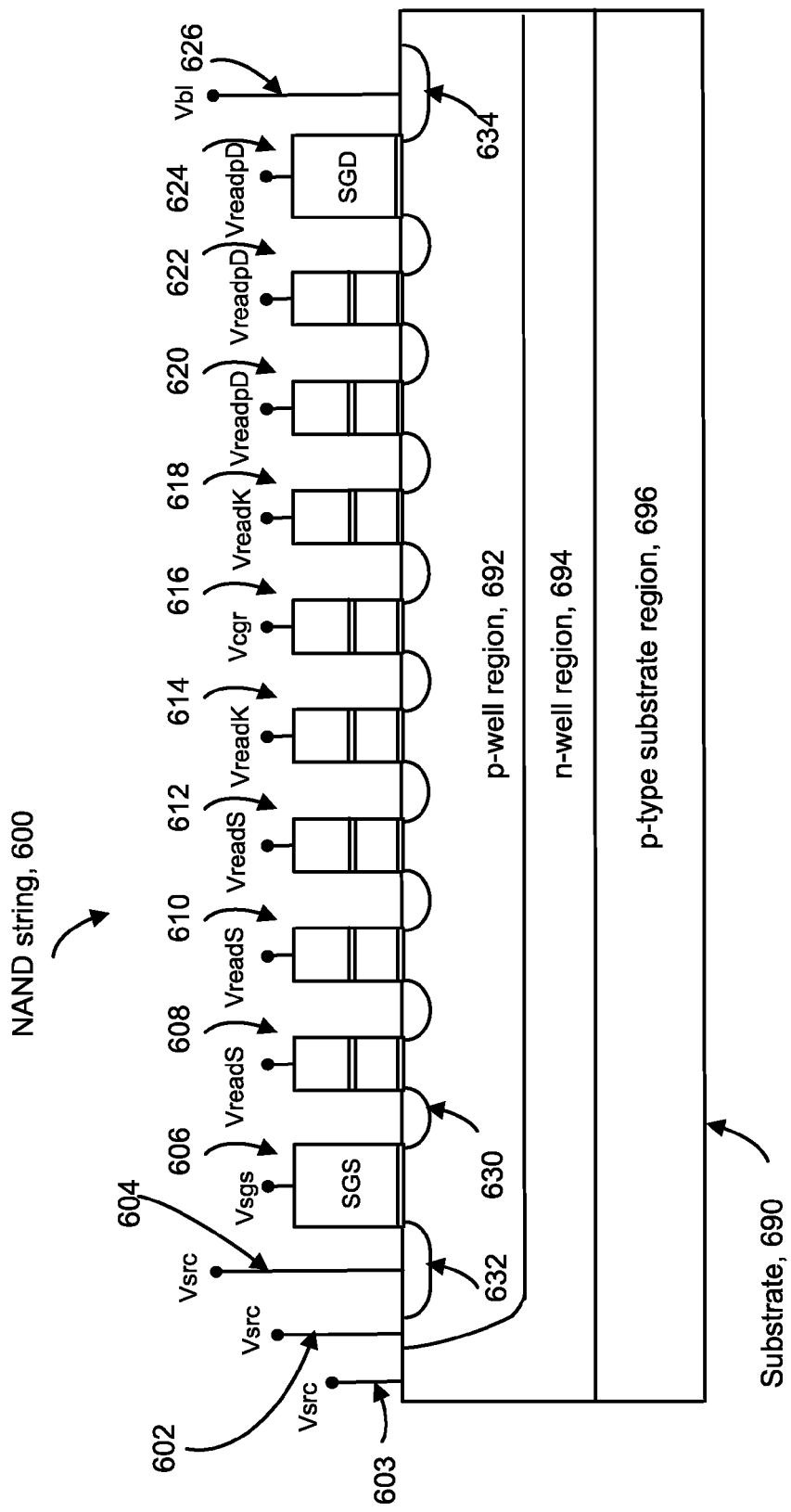
FIG. 16B shows one example of a scheme of read pass voltages applied to a NAND string during a program verify operation.

FIG. 16B shows one example of a scheme of read pass voltages applied to a NAND string during a program verify operation. In this scheme, there are three different read pass voltages. A first read pass voltage VreadS is applied between the source end of the NAND string and the second neighbor to the selected memory cell on the source side. A second read pass voltage VreadK is applied to each neighbor to the selected memory cell. A third read pass voltage VreadpD is applied between the drain end of the NAND string and the second neighbor to the selected memory cell on the drain side.

In the foregoing example, an assumption is made that the memory cells between the selected memory cell and the drain end of the NAND string have not yet been programmed. Therefore, their threshold voltages should still be low. For example, they may be still erased (but are not required to be in the erased state). Because it is expected that such memory cells have a low threshold voltages, the magnitude of the read pass voltage (VreadpD) can be quite low.

Similar to the read example above, the magnitude of VreadS that is applied to each of the unselected memory cells may be the same for a particular sensing operation. However, the magnitude of VreadS during program verify depends on the location of the selected memory cell, in one embodiment. The magnitude of VreadS during program verify may drop as the selected memory cell is further from the source end of the NAND string. Such an example relationship was depicted in FIG. 15.

The magnitude of VreadpD that is applied to each of the unselected memory cells may be the same for a particular sensing operation. Moreover, the magnitude of VreadpD could be the same regardless of the position of the selected memory cell, although this is not a requirement.

Similarly, the magnitude of VreadK during program verify could be the same regardless of the position of the selected memory cell, although this is not a requirement.

Figure 17B:
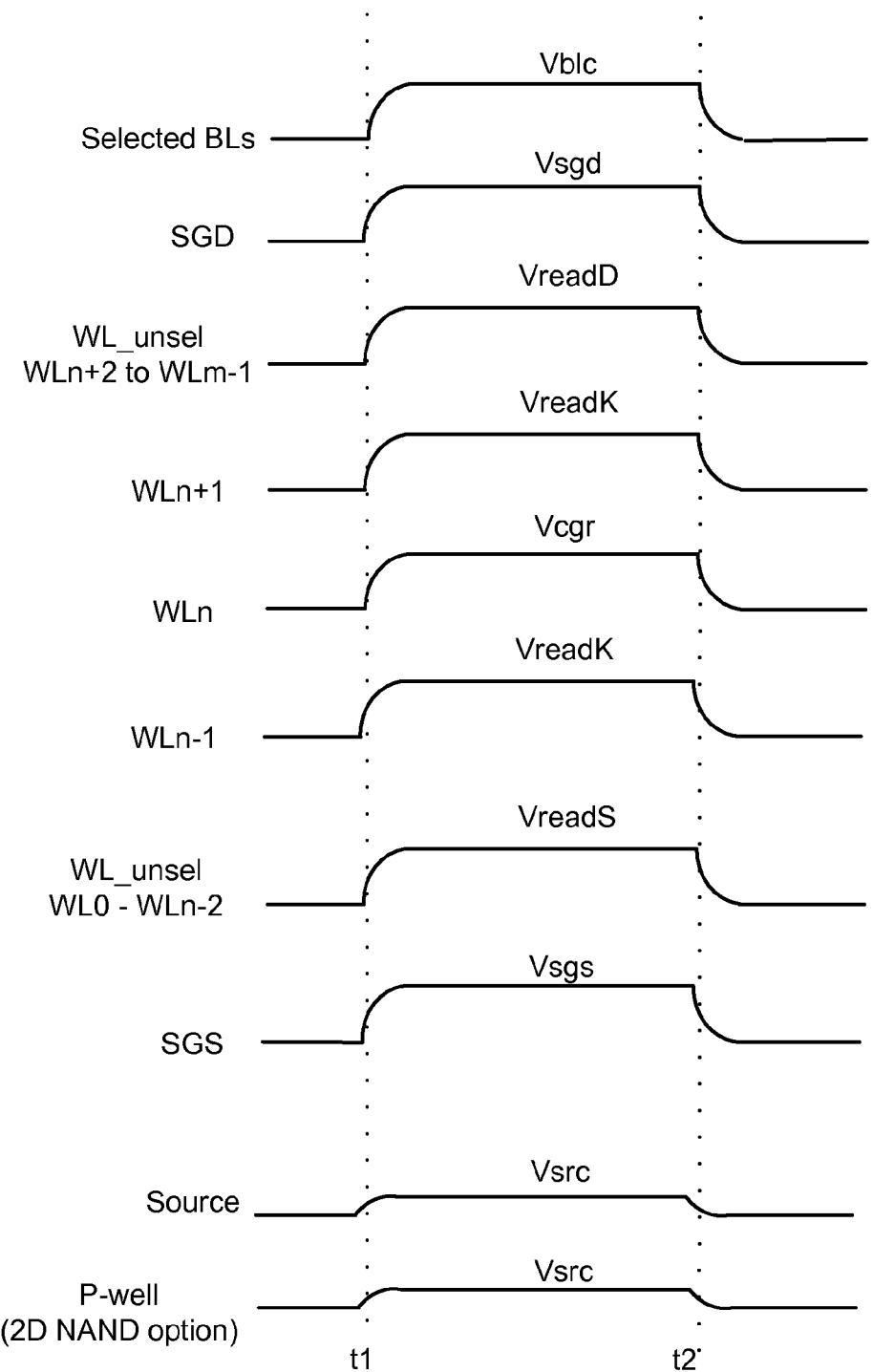
FIG. 17B depicts signals during a read operation for one embodiment of FIG. 17A.

FIG. 17A is a flowchart of one embodiment of a process of a read operation. There are many ways to measure the conduction current of a memory cell during a read operation. In one example, the conduction current of a memory cell is measured by the rate it discharges a dedicated capacitor in the sense amplifier. In one embodiment, a managing circuitry in the memory array can measure the conduction current of a memory cell by the rate it discharges a dedicated capacitor in the sense amplifier. In another example, the conduction current of the selected memory cell allows (or fails to allow) the NAND string that included the memory cell to discharge the bit line. The charge on the bit line is measured after a period of time to see whether it has been discharged or not. FIG. 17B depicts signals during a read operation in which the managing circuitry measures the conduction current of a memory cell by the rate it discharges a dedicated capacitor in the sense amplifier.

The steps of FIG. 17A are described in a particular order as a matter of convenience and do not necessarily happen in the described order. In step 1702, managing circuitry accesses information that indicates the distance of the selected memory cell from the source end of the NAND string. The number or location of the selected word line provides this information, in one embodiment. In one embodiment, the word lines are divided into different zones. In this case, the managing circuitry determines which zone the selected word line is in.

In step 1704, a voltage is applied to the common source line. The magnitude of the voltage depends on the location of the selected memory cell along the NAND string. For example, the magnitude depends on the distance of the selected memory cell from the source end of the NAND string. The magnitude of the voltage depends on the location of the selected word line (WLn), in one embodiment. FIG. 17B depicts Vsrc applied to the source (common source line) at time t1. In this example, WLn is the selected word line.

If the process is being applied in a 2D NAND that is formed on a substrate, then the substrate is biased to the same voltage as the common source line, in step 1706. Referring to FIG. 16A, the voltage Vsrc is applied to the p-well region 692. Additionally, Vsrc may also be applied to the n-well region 694. Referring to FIG. 17B, the voltage Vsc is shown applied to the P-well at time t1.

Note that for 3D NAND, there is not necessarily a substrate (e.g., well) to bias. Referring to FIG. 4B, as one example, one end of the NAND string can be biased from a voltage on bit line BLB0, and the other end of the NAND string can be biased from a voltage on source line SLB0. Additionally, the word lines (WL0-WL5) can provide a bias to the gates of the memory cells. However, there is not necessarily a fourth terminal that can be used to bias the body of the NAND string to a voltage other than the source line voltage. Referring to FIGS. 5A-5B, the channel 699 of the NAND string is completely surrounded by the memory cell. For example, region 699 is completely surrounded by regions 696, 697, 698. Also, there is a core 695 of silicon oxide (or some other insulator) inside the channel 699, in one embodiment. In another embodiment, there is no core 695. Either way, there is not an additional terminal to the body of the NAND string to which body biasing could be applied, for this example.

In step 1708, the selected bit lines are clamped to a clamp voltage. This may be achieved by the sense amplifier having circuitry that clamps the bit line to the clamp voltage. FIG. 17B depicts a bit line clamp voltage Vblc, which is applied to the selected bit lines at time t1. In this case, the sense module 880 holds the selected bit line voltage constant regardless of what the NAND string is doing, so the sense module 880 measures the current flowing with the bit line "clamped" to that voltage. Therefore, the bit line voltage rises at t1 and does not change during the sensing operation. In one embodiment, Vblc is greater than Vsrc. Thus, any conduction current will flow from the bit line to the common source line 128.

In step 1710, voltages are applied to the source and drain side select lines. These voltages are of a suitable magnitude to turn on the source and drain side select gates of the NAND strings, given other voltages such as those on the bit lines and common source line. Turning on the source side select gate connects the source side of the NAND strings to the common source line 128. Turning on the drain side select gate connects the drain side of each NAND string to its respective bit line. FIG. 17B depicts a voltage Vsgs applied to SGS (source side select gate line) and a voltage Vsgd applied to SGD (drain side select gate line) at time t1.

In step 1712, a read pass voltage is applied to source side unselected word lines. The magnitude of the read pass voltage depends on the location of the selected memory cell along the NAND string. For example, the magnitude depends on the distance of the selected memory cell from the source end of the NAND string.

FIG. 17B depicts a read pass voltage VreadS applied to unselected word lines WL0 to WLn−2 at time t1. In this example, VreadS is the same for each of the unselected word lines between WL0 to WLn−2 for this sense operation. However, the magnitude of VreadS depends on the location of the selected word line WLn. In one embodiment, the managing circuitry determines the magnitude of VreadS based on what zone the selected word line WLn is in.

In step 1714, a read pass voltage is applied to unselected word lines that neighbor the selected word line. FIG. 17B depicts a read pass voltage VreadK applied to unselected word lines WLn−1 and WLn+1 at time t1. The magnitude of this voltage is not required to depend on the location of the selected word line.

In step 1716, a read pass voltage is applied to drain side unselected word lines. The magnitude of the read pass voltage depends on the location of the selected memory cell along the NAND string. For example, the magnitude depends on the distance of the selected memory cell from the source end of the NAND string.

FIG. 17B depicts a read pass voltage VreadD applied to unselected word lines WLn+2 to WLm at time t1. In this example, WLm−1 is the word line closest to the drain side select line (SGS). In this example, VreadD is the same for each of the unselected word lines between WLn+2 to WLm−1 for this sense operation. However, the magnitude of VreadD depends on the location of the selected word line WLn. In one embodiment, the managing circuitry determines the magnitude of VreadD based on what zone the selected word line WLn is in.

In step 1718, one or more read reference voltage are applied to the selected word line (WLn). FIG. 17B depicts the voltage Vcgr applied to the selected word line at time t1. Examples of Vcgr are Vra, Vrb, and Vrc (see FIG. 11B). After applying Vcgr, the bit line associated with each NAND string is sensed to determine a condition of the selected memory cell. The sensing of the selected bit line is achieved by the sense module 880 determining whether a sense capacitor in the sense module 880 has dissipated a sufficient amount, in one embodiment. For example, the sense capacitor is charged while it is not connected to the bit line. Then, the sense capacitor is connected to the bit line for some pre-determined period of time to allow the conduction current from the selected memory cell to discharge the sense capacitor. Then, the voltage on the sense capacitor is sensed to determine a condition of the memory cell.

Figure 18B:
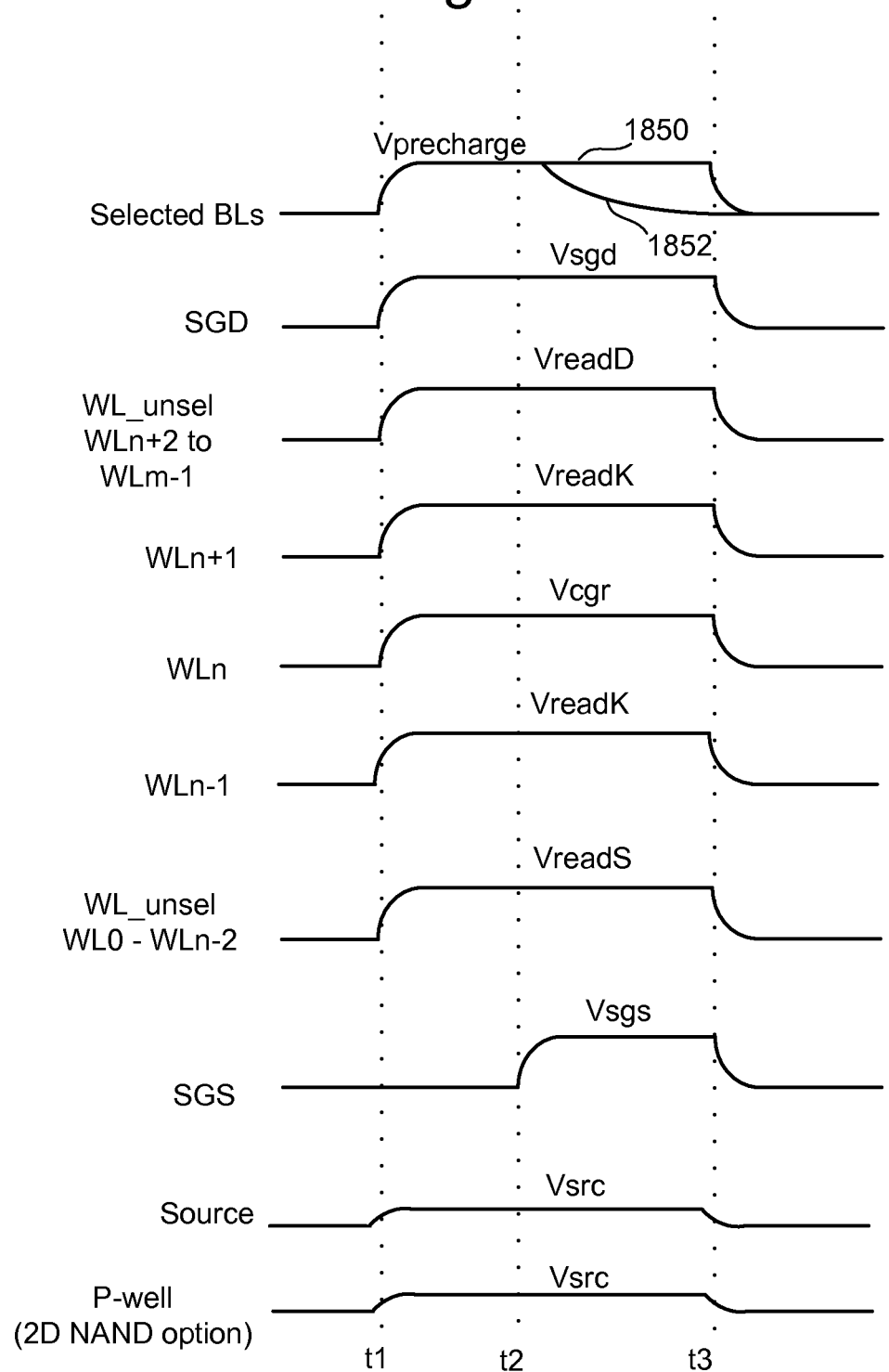
FIG. 18B depicts signals during a read operation depicts signals during a read operation for one embodiment of FIG. 18A.

As noted, another sensing option is to pre-charge the selected bit lines to a pre-charge voltage. Then, a selected bit line is allowed to discharged, based on the conduction current of the selected memory cell. FIG. 18A depicts a flowchart of one embodiment that uses such sensing. FIG. 18B depicts signals during one such embodiment. Steps of FIG. 18A that are similar to those of FIG. 17A have the same reference numerals and will not be discussed in detail. Also, many of the signals in FIG. 18B are similar to those of FIG. 17B, and will not be discussed in detail.

In step 1702, managing circuitry accesses information that indicates the distance of the selected memory cell from the source end of the NAND string. The number or location of the selected word line provides this information, in one embodiment.

In step 1704, a voltage is applied to the common source line 128. The magnitude of the voltage depends on the location of the selected memory cell along the NAND string.

If the process is being applied in a 2D NAND that is formed on a substrate, then the substrate is biased to the same voltage as the common source line 128, in step 1706.

In step 1808, the selected bit lines are pre-charged. This may be achieved by the sense amplifier having circuitry that pre-charges the bit line to a desired voltage. FIG. 18B depicts the selected bit line voltage being increased to Vprecharge at time t1.

In step 1810, a voltage is applied to the drain side select line. This voltage is of a suitable magnitude to turn on the drain side select gates of the NAND strings, given other voltages such as those on the bit lines. FIG. 18B depicts a voltage Vsgd applied to SGD (drain side select gate line) at time t1.

In step 1712, a read pass voltage (e.g., VreadS) is applied to source side unselected word lines. The magnitude of the read pass voltage depends on the location of the selected memory cell along the NAND string.

In step 1714, a read pass voltage is applied to unselected word lines that neighbor the selected word line. The magnitude of this voltage is not required to depend on the location of the selected word line.

In step 1716, a read pass voltage (e.g., VreadD) is applied to drain side unselected word lines. The magnitude of the read pass voltage depends on the location of the selected memory cell along the NAND string.

In step 1817, the NAND strings are allowed to control the voltage on their respective bit lines. This may be achieved by circuitry in the sense module 880. For example, a transistor that was applying the pre-charge voltage to the bit lines can be disconnected from the bit lines. Additionally, the source side of the NAND strings may be connected to the common source line 128 to allow current to flow from the NAND string to the common source line 128. FIG. 18B shows the voltage on the common source line SGS going to Vsgs at time t2.

In step 1718, one or more read reference voltage are applied to the selected word line (WLn).

In step 1820, the bit lines are sensed. If the threshold voltage of the memory cell selected for reading is greater than Vcgr applied to the selected word line WLn, then the selected memory cell will not turn on and the bit line will not discharge, as depicted by signal line 1850. If the threshold voltage in the memory cell selected for reading is below Vcgr or below the verify level applied to the selected word line WLn, then the memory cell selected for reading will turn on (conduct) and the bit line voltage will dissipate, as depicted by curve 1852. At some point after time t2 and prior to time t3 (as determined by the particular implementation), the sense module 880 will determine whether the bit line voltage has dissipated a sufficient amount. Thus, the condition of the memory cell with respect to the reference voltage is determined.

Figure 19B:
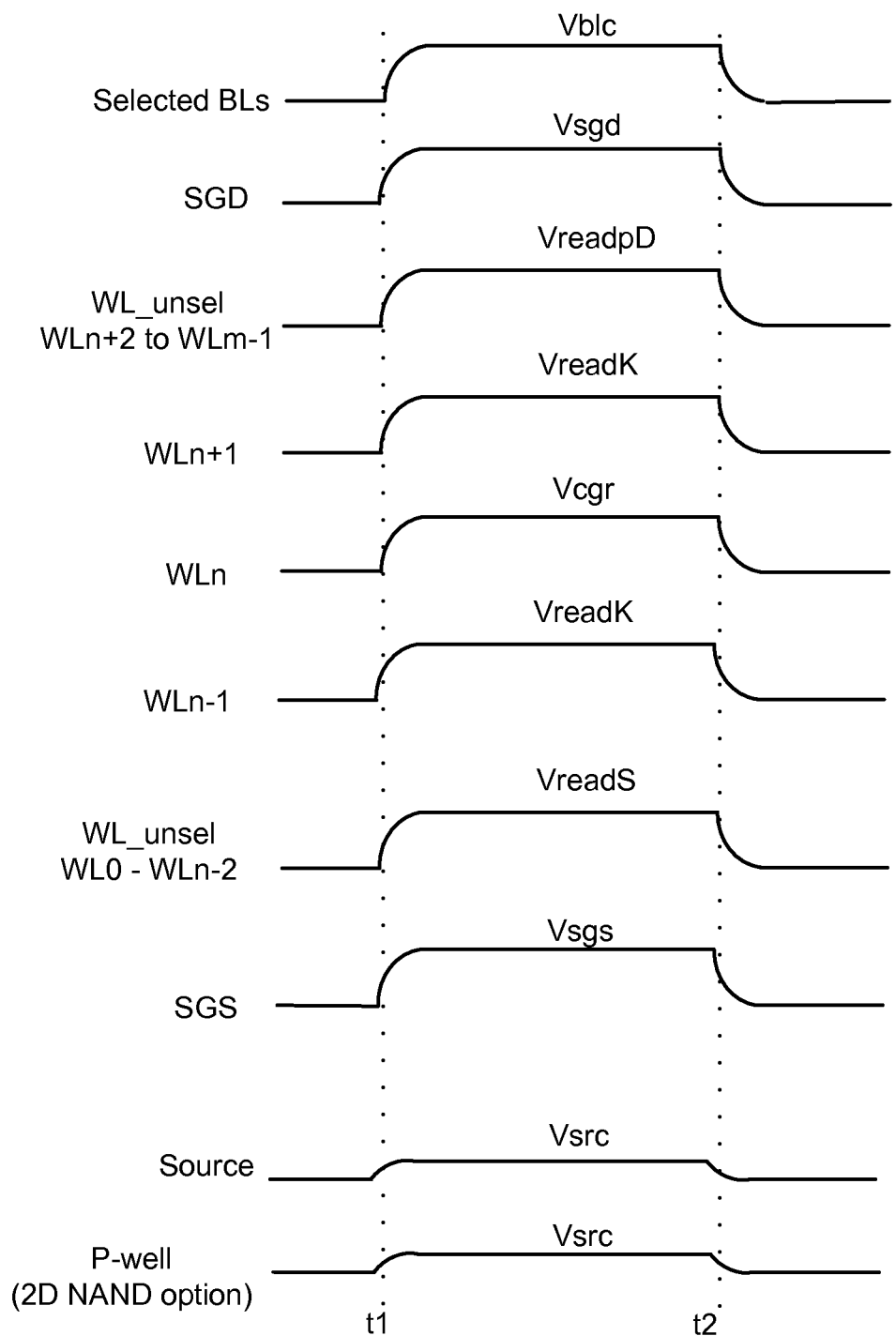
FIG. 19B depicts signals during a read operation for one embodiment of FIG. 19A.

FIG. 19A is a flowchart of one embodiment of a process of a program verify operation. FIG. 19B depicts signals during a program verify operation for an array of memory cells that measure the conduction current of a memory cell by the rate it discharges a dedicated capacitor in the sense amplifier. FIGS. 19A and 17A have many similarities. Similar steps in the Figures will use the same reference numerals, and will not be discussed in detail to avoid repetition.

In step 1702, managing circuitry accesses information that indicates the distance of the selected memory cell from the source end of the NAND string.

In step 1704, a voltage is applied to the common source line 128. The magnitude of the voltage depends on the location of the selected memory cell along the NAND string. FIG. 19B depicts Vsrc applied to the source (common source line) at time t1.

If the process is being applied in a 2D NAND that is formed on a substrate, then the substrate is biased to the same voltage as the common source line, in step 1706. Referring to FIG. 19B, the voltage Vsrc is shown applied to the P-well.

In step 1708, the selected bit lines are clamped to a clamp voltage. FIG. 19B depicts a bit line clamp voltage Vblc, which is applied to the selected bit lines at time t1.

In step 1710, voltages are applied to the source side and drain side select lines. FIG. 19B depicts a voltage Vsgs applied to SGS (source side select gate line) and a voltage Vsgd applied to SGD (drain side select gate line) at time t1.

In step 1712, a read pass voltage is applied to source side unselected word lines. The magnitude of the read pass voltage depends on the location of the selected memory cell along the NAND string. For example, the magnitude depends on the distance of the selected memory cell from the source end of the NAND string. FIG. 19B depicts a read pass voltage VreadS applied to unselected word lines WL0-WLn−2 at time t1.

In step 1714, a read pass voltage is applied to unselected word lines that neighbor the selected word line. FIG. 17B depicts a read pass voltage VreadK applied to unselected word lines WLn−1 and WLn+1 at time t1. The magnitude of this voltage is not required to depend on the location of the selected word line.

In step 1916, a read pass voltage is applied to drain side unselected word lines. The magnitude of this voltage is not required to depend on the location of the selected word line.

FIG. 19B depicts a read pass voltage VreadpD applied to unselected word lines WLn+2 to WLm−1 at time t1. In this example, WLm−1 is the word line closest to the drain side select line (SGS). The voltage VreadpD was discussed in connection with FIG. 16B.

In step 1918, one or more program verify reference voltage are applied to the selected word line (WLn). FIG. 19B depicts the voltage Vcgr applied to the selected word line at time t1.

This could be any of the program verify voltages VvA, VvB, VvC in FIG. 11B, for an example of storing two bits per memory cell.

After applying Vcgr, the bit line associated with each NAND string is sensed to determine a condition of the selected memory cell, in step 1720. Sensing may be similar as in step 1720 of FIG. 17A.

Figure 20A:
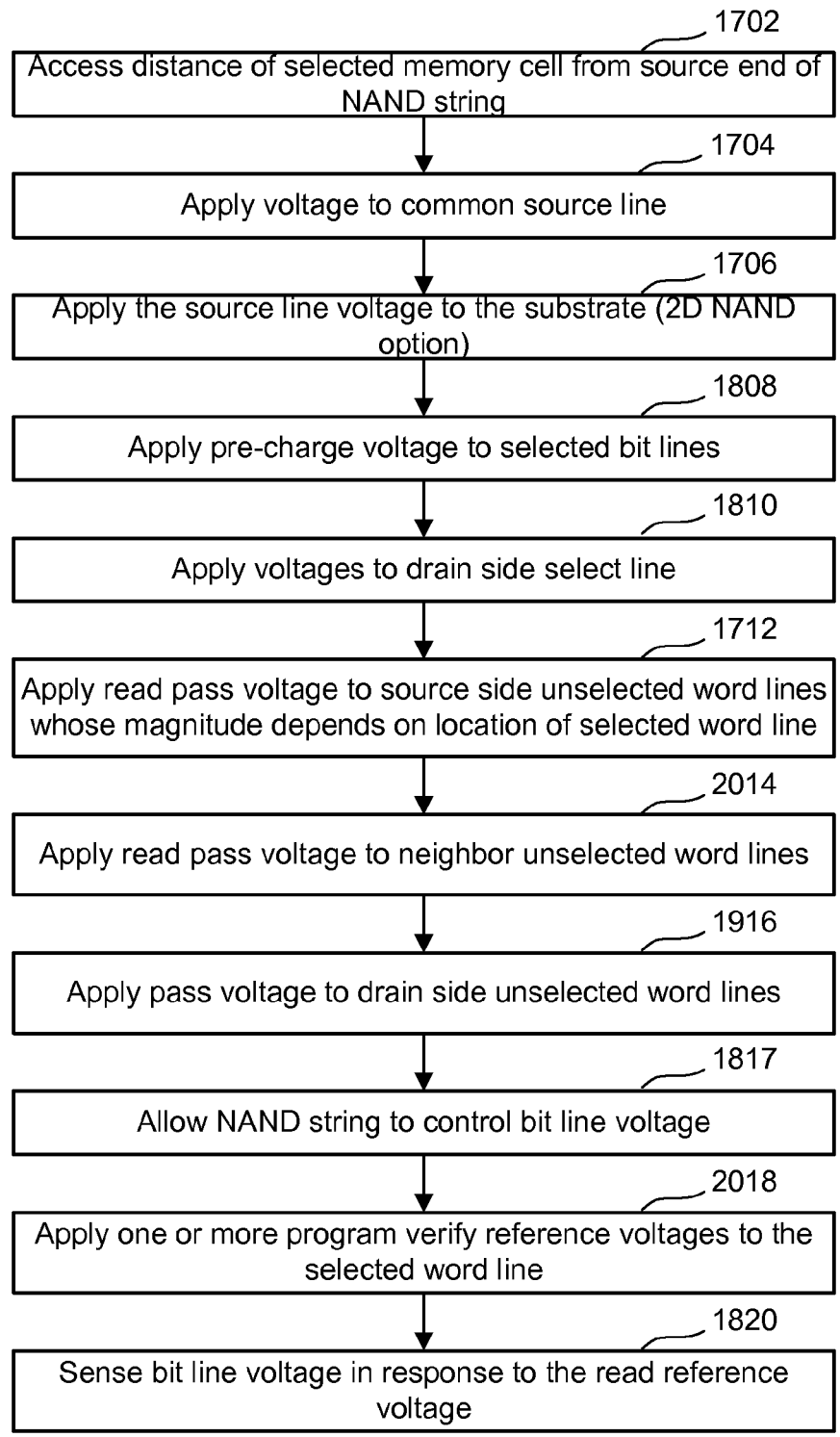
FIG. 20A is a flowchart of one embodiment of a process of a program verify operation that senses how much voltage has discharged from a bit line.
Figure 20B:
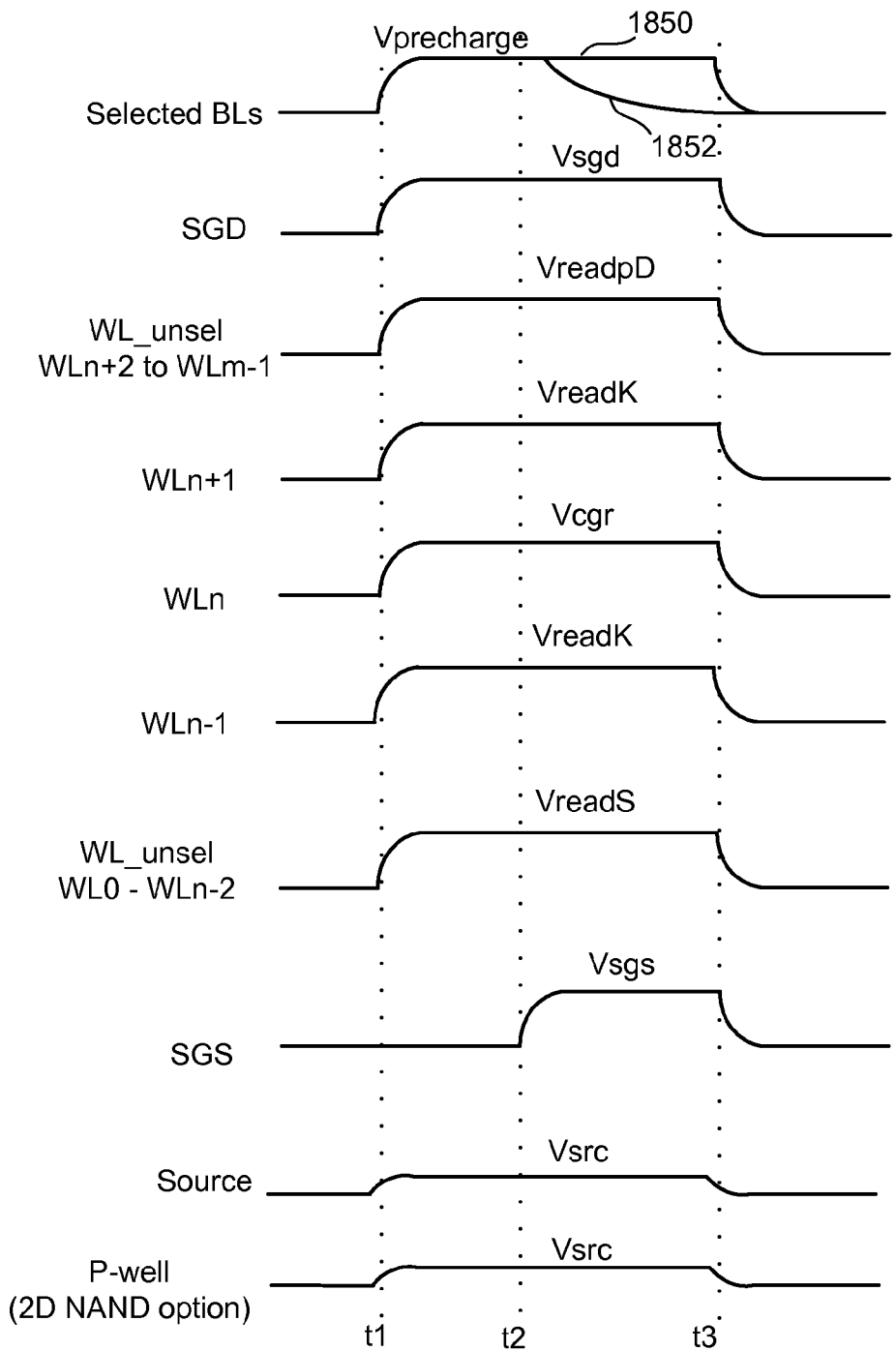
FIG. 20B depicts signals during a read operation depicts signals during a read operation for one embodiment of FIG. 20A.

As noted in the read operation example of FIG. 18A, another sensing option is to pre-charge the selected bit lines to a pre-charge voltage. Then, a selected bit line is allowed to discharged, based on the conduction current of the selected memory cell. FIG. 20A depicts a flowchart of one embodiment that uses such sensing for a program verify operation. FIG. 20B depicts signals during one such embodiment for a program verify operation. Steps of FIG. 20A that are similar to those of FIGS. 17A, 18A, and/or 19A have the same reference numerals and will not be discussed in detail. Also, many of the signals in FIG. 20B are similar to those of FIGS. 17B, 18B, and/or 19B, and will not be discussed in detail.

In step 1702, managing circuitry accesses information that indicates the distance of the selected memory cell from the source end of the NAND string. The number or location of the selected word line provides this information, in one embodiment.

In step 1704, a voltage is applied to the common source line. The magnitude of the voltage depends on the location of the selected memory cell along the NAND string.

If the process is being applied in a 2D NAND that is formed on a substrate, then the substrate is biased to the same voltage as the common source line, in step 1706.

In step 1808, the selected bit lines are pre-charged. This may be achieved by the sense module 880 having circuitry that pre-charges the bit line to a desired voltage. FIG. 20B depicts the selected bit line voltage being increased to Vpre-charge at time t1.

In step 1810, a voltage is applied to the drain side select lines. These voltages are of a suitable magnitude to turn on the drain side select gates of the NAND strings, given other voltages such as those on the bit lines. FIG. 20B depicts a voltage Vsgd applied to SGD (drain side select gate line) at time t1.

In step 1712, a read pass voltage is applied to source side unselected word lines. The magnitude of the read pass voltage depends on the location of the selected memory cell along the NAND string. FIG. 20B shows VreadS being applied to word lines WL0 to Wln−2 at time t1.

In step 2014, a read pass voltage is applied to unselected word lines that neighbor the selected word line. The magnitude of this voltage is not required to depend on the location of the selected word line.

In step 1916, a pass voltage is applied to drain side unselected word lines. The magnitude of this voltage is not required to depend on the location of the selected word line. FIG. 20B shows VreadpD being applied to word lines WLn+2 to WLm−1 at time t1.

In step 1817, the NAND strings are allowed to control the voltage on their respective bit lines. This may be achieved by circuitry in the sense module 880. For example, a transistor that was applying the pre-charge voltage to the bit lines can be disconnected from the bit lines. Additionally, the source side of the NAND strings may be connected to the common source line 128 to allow current to flow from the NAND string to the common source line. FIG. 20B shows the voltage on the common source line SGS going to Vsgs at time t2, which turns on the source side select gates to connect the NAND strings to the common source line 128.

In step 2018, one or more program verify reference voltage are applied to the selected word line (WLn).

In step 1820, the bit lines are sensed. If the threshold voltage of the memory cell selected for reading is greater than Vcgr applied to the selected word line WLn, then the selected memory cell will not turn on and the bit line will not discharge, as depicted by signal line 1850. If the threshold voltage in the memory cell selected for reading is below Vcgr or below the verify level applied to the selected word line WLn, then the memory cell selected for reading will turn on (conduct) and the bit line voltage will dissipate, as depicted by curve 1852. At some point after time t2 and prior to time t3 (as determined by the particular implementation), the sense amplifier will determine whether the bit line voltage has dissipated a sufficient amount. Thus, the condition of the memory cell with respect to the reference voltage is determined.

Note that many variations of the embodiments described in connection with FIGS. 17A-20B are possible. There are many other alternatives for applying read pass voltages to unselected word lines. In the examples, the group of word lines on the source side of the selected word line to which VreadS was applied included all but the neighbor word line to the selected word line. However, VreadS could be applied to a smaller group of unselected word lines on the source side of the selected word line. Likewise, the group of word lines on the drain side of the selected word line to which VreadD was applied (for the read operation) included all but the neighbor word line to the selected word line. However, VreadD could be applied to a smaller group of unselected word lines on the drain side of the selected word line. However, the same principle of having VreadS and/or VreadD have its magnitude depend on the location of the selected word line can be used.

One embodiment includes a non-volatile storage device comprising: a plurality of strings of non-volatile storage elements, each string having a drain end and a source end; a common source line switchably coupled to the source end of each of the strings; a plurality of bit lines, wherein the drain end of each of the strings is associated with a bit line of the plurality of bit lines; a plurality of word lines associated with the plurality of strings; and managing circuitry in communication with the common source line and the plurality of word lines. The managing circuitry is configured to apply a reference voltage to a selected word line of the plurality of word lines. The managing circuitry is configured to apply a first voltage to the common source line while the reference voltage is applied to the selected word. The managing circuitry is configured to sense a condition of respective selected non-volatile storage elements on the plurality of strings that are associated with the selected word line in response to the reference voltage. The first voltage has a magnitude that depends on the distance between the source end of the respective strings and the respective selected non-volatile storage elements and results in the same amount of back bias to the strings regardless of the distance between the source end of the respective strings and the respective selected non-volatile storage elements.

In one embodiment of the device of the previous paragraph, the first voltage applied by the managing circuitry has a magnitude that is lower when a given selected non-volatile storage element is farther from the source end of the given selected non-volatile storage element's string.

In one embodiment of the device of the two previous paragraphs, the managing circuitry does not apply any back bias to the plurality of strings when applying the first voltage to the common source line.

In one embodiment of the device of the three previous paragraphs, the plurality of strings are NAND strings that reside in a well of a substrate. The managing circuitry applies the first voltage to the well when the managing circuitry applies the first voltage to the common source line and the reference voltage to the selected word line.

One embodiment includes a method of operating non-volatile storage device. The method comprises the following steps. A reference voltage is applied to a selected word line out of a plurality of word lines associated with a plurality of NAND strings. A first end of each of the plurality of NAND strings is connected to a common source line. A first voltage is applied to the common source line while applying the reference voltage to the selected word line. The first voltage does not result in body bias to the plurality of NAND strings. A condition of respective selected non-volatile storage elements on the plurality of NAND strings that are associated with the selected word line is sensed in response to the reference voltage. The first voltage has a magnitude that depends on the distance between the first end of the respective NAND strings and the respective selected non-volatile storage elements.

In one embodiment of the method of the previous paragraph, applying the first voltage to the common source line while applying the reference voltage to the selected word line comprises: applying the first voltage having a first magnitude to the common source line when the selected non-volatile storage element is close to the first end of its NAND string; and applying the first voltage having a second magnitude to the common source line when the selected non-volatile storage element is far from the first end of its NAND string, wherein the second magnitude is lower than the first magnitude.

One embodiment includes a three-dimensional (3D) non-volatile storage device comprising: a substrate; a plurality of conductive layers above the substrate, wherein the plurality of conductive layers comprise a plurality of word lines; a plurality of insulator layers alternating with the conductive layers in a stack above the substrate; and a three-dimensional memory array comprising a plurality of vertically-oriented NAND strings extending through the conductive layers and insulator layers above the substrate. Each vertically-oriented NAND string comprises a plurality of non-volatile storage elements and a vertically-oriented channel. Each of the vertically-oriented channels is surrounded by the non-volatile storage elements of the respective NAND string, each NAND string having a drain end and a source end. The storage device further comprises a common source line switchably coupled to the source end of the channel of each of the plurality of vertically-oriented NAND strings; and managing circuitry in communication with the plurality of word lines and the common source line. The managing circuitry applies a reference voltage to a selected word line of the plurality of word lines. The managing circuitry applies a first voltage to the common source line while the reference voltage is applied to the selected word. The first voltage does not result in body bias to the plurality of NAND strings. The managing circuitry senses a condition of respective selected non-volatile storage elements on the plurality of NAND strings that are associated with the selected word line in response to the reference voltage. The first voltage has a magnitude that depends on the location of the respective selected non-volatile storage elements along the plurality of NAND strings.

One embodiment includes a method of operating three-dimensional (3D) non-volatile storage device comprising: a substrate; a plurality of conductive layers above the substrate, wherein the plurality of conductive layers comprise a plurality of word lines; a plurality of insulator layers alternating with the conductive layers in a stack above the substrate; a three-dimensional memory array comprising a plurality of vertically-oriented NAND strings extending through the conductive layers and insulator layers above the substrate, each vertically-oriented NAND string comprising a plurality of non-volatile storage elements and a vertically-oriented channel, each of the vertically-oriented channels being surrounded by the non-volatile storage elements of the respective NAND string, each NAND string having a drain end and a source end; a common source line coupled to the source end of the channel of each of the plurality of vertically-oriented NAND strings. The method comprises: applying a reference voltage to a selected word line of the plurality of word lines; applying a first voltage to the common source line while the reference voltage is applied to the selected word, wherein the first voltage does not result in body bias to the plurality of NAND strings; and sensing a condition of respective selected non-volatile storage elements on the plurality of NAND strings that are associated with the selected word line in response to the reference voltage, wherein a magnitude of the first voltage depends on the distance between the respective selected non-volatile storage elements and the source end of the NAND string.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles and practical applications, to thereby enable others skilled in the art to best utilize the various embodiments and with various modifications as are suited to the particular use contemplated. It is intended that the scope be defined by the claims appended hereto.

What is claimed is:

1. A non-volatile storage device comprising:
a plurality of strings of non-volatile storage elements, each string having a drain end and a source end;
a common source line switchably coupled to the source end of each of the strings;
a plurality of bit lines, wherein the drain end of each of the strings is associated with a bit line of the plurality of bit lines;
a plurality of word lines associated with the plurality of strings; and
managing circuitry in communication with the common source line and the plurality of word lines, wherein the managing circuitry is configured to apply a reference voltage to a selected word line of the plurality of word lines, wherein the managing circuitry is configured to apply a first voltage to the common source line while the reference voltage is applied to the selected word line, wherein the managing circuitry is configured to sense a condition of respective selected non-volatile storage elements on the plurality of strings that are associated with the selected word line in response to the reference voltage, wherein the first voltage has a magnitude that depends on the distance between the source end of the respective strings and the respective selected non-volatile storage elements and results in the same amount of back bias to the strings regardless of which of the plurality of word lines is selected.

2. The non-volatile storage device of claim 1, wherein the first voltage has a magnitude that is lower when a given selected non-volatile storage element is farther from the source end of the given selected non-volatile storage element's string.

3. The non-volatile storage device of claim 1, wherein the managing circuitry is configured to apply a pass voltage to an unselected word line of the plurality of word lines while the managing circuitry applies the reference voltage to the selected word line and the first voltage to the common source line, wherein the pass voltage applied to the unselected word line has a magnitude that depends on the magnitude of the first voltage.

4. The non-volatile storage device of claim 1, wherein the managing circuitry is configured to apply a first pass voltage to an unselected word line of the plurality of word lines that is between the source end of the strings and the selected word line and is configured to apply a second pass voltage to an unselected word line of the plurality of word lines that is between the drain end of the strings and the selected word line, wherein the first and second pass voltages have different magnitudes, wherein the managing circuitry is configured to apply the first and second pass voltages while the managing circuitry applies the reference voltage to the selected word line and the first voltage to the common source line, wherein the first pass voltage applied to the unselected word line has a magnitude that depends on the magnitude of the first voltage.

5. The non-volatile storage device of claim 4, wherein both the first pass voltage and the second pass voltage have a magnitude that depends on which of the plurality of word lines is selected.

6. The non-volatile storage device of claim 1, wherein the reference voltage is a read reference voltage during a read operation or a program verify reference voltage during a program verify operation, wherein the first voltage has a magnitude whose dependence moves in the same direction with respect to location of the selected non-volatile storage element for both the read operation and the program verify operation.

7. The non-volatile storage device of claim 1, wherein the managing circuitry does not apply any back bias to the plurality of strings when applying the first voltage to the common source line.

8. The non-volatile storage device of claim 1, further comprising:
a substrate; and
a well formed in the substrate, wherein the plurality of strings are NAND strings that reside in the well, wherein the managing circuitry applies the first voltage to the well when the managing circuitry applies the first voltage to the common source line and the reference voltage to the selected word line.

9. The non-volatile storage device of claim 1, further comprising:
a substrate; and
a three-dimensional memory array formed above the substrate, wherein the plurality of strings are vertical NAND strings in the three-dimensional memory array.

10. A method of operating non-volatile storage device, the method comprising:
applying a reference voltage to a selected word line out of a plurality of word lines associated with a plurality of NAND strings, wherein a first end of each of the plurality of NAND strings is connected to a common source line;
applying a first voltage to the common source line while applying the reference voltage to the selected word line, wherein the first voltage does not result in body bias to the plurality of NAND strings; and
sensing a condition of respective selected non-volatile storage elements on the plurality of NAND strings that are associated with the selected word line in response to the reference voltage, wherein the first voltage has a magnitude that depends on the distance between the first end of the respective NAND strings and the respective selected non-volatile storage elements.

11. The method of claim 10, wherein applying the first voltage to the common source line while applying the reference voltage to the selected word line comprises:
applying the first voltage having a first magnitude to the common source line when the selected non-volatile storage element is close to the first end of its NAND string; and
applying the first voltage having a second magnitude to the common source line when the selected non-volatile storage element is far from the first end of its NAND string, wherein the second magnitude is lower than the first magnitude.

12. The method of claim 10, wherein the managing circuitry is configured to apply a pass voltage to an unselected word line of the plurality of word lines while the managing circuitry applies the reference voltage to the selected word line and the first voltage to the common source line, wherein the magnitude of the pass voltage applied to the unselected word line depends on the distance between the first end of the respective NAND strings and the respective selected non-volatile storage elements.

13. The method of claim 10, wherein the reference voltage is either a read reference voltage during a read operation or a verify reference voltage during a program verify operation, wherein the first voltage has a magnitude that is lower when the respective selected non-volatile storage element is farther from the first end of the respective-selected non-volatile storage element's NAND string for both the read operation and the program verify operation.

14. The method of claim 10, wherein applying the first voltage to the common source line that does not result in body bias to the plurality of NAND strings comprises:
applying the first voltage to a substrate while applying the reference voltage to the selected word line and while applying the first voltage to the common source line, wherein the plurality of NAND strings are formed in the substrate.

15. A three-dimensional (3D) non-volatile storage device comprising:
a substrate;
a plurality of conductive layers above the substrate, wherein the plurality of conductive layers comprise a plurality of word lines;
a plurality of insulator layers alternating with the conductive layers in a stack above the substrate;
a three-dimensional memory array comprising a plurality of vertically-oriented NAND strings extending through the conductive layers and insulator layers above the substrate, each vertically-oriented NAND string comprising a plurality of non-volatile storage elements and a vertically-oriented channel, each of the vertically-oriented channels being surrounded by the non-volatile storage elements of the respective NAND string, each NAND string having a drain end and a source end;
a common source line switchably coupled to the source end of the channel of each of the plurality of vertically-oriented NAND strings; and
managing circuitry in communication with the plurality of word lines and the common source line, wherein the managing circuitry applies a reference voltage to a selected word line of the plurality of word lines, wherein the managing circuitry applies a first voltage to the common source line while the reference voltage is applied to the selected word line, wherein the first voltage does not result in body bias to the plurality of NAND strings, wherein the managing circuitry senses a condition of respective selected non-volatile storage elements on the plurality of NAND strings that are associated with the selected word line in response to the reference voltage, wherein the first voltage has a magnitude that depends on the location of the respective selected non-volatile storage elements along the plurality of NAND strings.

16. The three-dimensional (3D) non-volatile storage device of claim 15, wherein the first voltage has a magnitude that is lower when a given selected non-volatile storage element is farther from the source end of its NAND string.

17. The three-dimensional (3D) non-volatile storage device of claim 15, wherein the managing circuitry applies a pass voltage to an unselected word line of the plurality of word lines while the managing circuitry applies the reference voltage to the selected word line and the first voltage to the common source line, wherein the magnitude of the pass voltage applied to the unselected word line depends on the magnitude of the first voltage.

18. The three-dimensional (3D) non-volatile storage device of claim 15, wherein the reference voltage is either a read reference voltage during a read operation or a verify reference voltage during a program verify operation, wherein the first voltage has a magnitude whose dependence moves in the same direction with respect to location of the selected non-volatile storage element for both the read operation and the program verify operation.

19. A method of operating three-dimensional (3D) non-volatile storage device comprising: a substrate; a plurality of conductive layers above the substrate, wherein the plurality of conductive layers comprise a plurality of word lines; a plurality of insulator layers alternating with the conductive layers in a stack above the substrate; a three-dimensional memory array comprising a plurality of vertically-oriented NAND strings extending through the conductive layers and insulator layers above the substrate, each vertically-oriented NAND string comprising a plurality of non-volatile storage elements and a vertically-oriented channel, each of the vertically-oriented channels being surrounded by the non-volatile storage elements of the respective NAND string, each NAND string having a drain end and a source end; a common source line coupled to the source end of the channel of each of the plurality of vertically-oriented NAND strings, wherein the method comprises:

applying a reference voltage to a selected word line of the plurality of word lines;

applying a first voltage to the common source line while the reference voltage is applied to the selected word line, wherein the first voltage does not result in body bias to the plurality of NAND strings;

sensing a condition of respective selected non-volatile storage elements on the plurality of NAND strings that are associated with the selected word line in response to the reference voltage, wherein a magnitude of the first voltage depends on the distance between the respective selected non-volatile storage elements and the source end of the NAND string.

20. The method of claim 19, wherein the first voltage has a magnitude that is greater when the selected non-volatile storage elements are closer to the drain end of their respective NAND strings.

21. The method of claim 20, further comprising:
applying a pass voltage to an unselected word line of the plurality of word lines while applying the reference voltage to the selected word line and the first voltage to the common source line, wherein the magnitude of the pass voltage applied to the unselected word line depends on the magnitude of the first voltage.

* * * * *